US012677576B2

(12) United States Patent
Park et al.

(10) Patent No.: US 12,677,576 B2
(45) Date of Patent: Jul. 7, 2026

(54) ORGANIC LIGHT EMITTING DISPLAY APPARATUS

(71) Applicant: LG Display Co., Ltd., Seoul (KR)

(72) Inventors: SeHong Park, Paju-si (KR); Wonrae Kim, Paju-si (KR); WonSik Lee, Paju-si (KR); Inae Choi, Paju-si (KR); Sejong Seong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 394 days.

(21) Appl. No.: 18/545,534

(22) Filed: Dec. 19, 2023

(65) Prior Publication Data

US 2024/0224759 A1     Jul. 4, 2024

(30) Foreign Application Priority Data

Dec. 29, 2022     (KR) ........................ 10-2022-0188341

(51) Int. Cl.
*H10K 59/80*          (2023.01)
*H10K 59/124*          (2023.01)
*H10K 59/35*          (2023.01)

(52) U.S. Cl.
CPC ......... *H10K 59/879* (2023.02); *H10K 59/124* (2023.02); *H10K 59/351* (2023.02); *H10K 59/80515* (2023.02); *H10K 59/8791* (2023.02)

(58) Field of Classification Search
CPC ........... H10K 59/80515; H10K 59/879; H10K 59/8791
See application file for complete search history.

(56) References Cited

U.S. PATENT DOCUMENTS

| | | | |
|---|---|---|---|
| 2018/0158887 A1* | 6/2018 | Yun | ........................ H10K 10/88 |
| 2021/0183963 A1 | 6/2021 | Jang et al. | |
| 2022/0140291 A1 | 5/2022 | Kim et al. | |

* cited by examiner

*Primary Examiner* — Daniel P Shook
(74) *Attorney, Agent, or Firm* — Birch, Stewart, Kolasch & Birch, LLP

(57)     ABSTRACT

Discussed in an organic light emitting display apparatus, which can include a plurality of pixels on a substrate, each pixel including a plurality of subpixels, and each of the plurality of subpixels having an emission region, a planarization layer including a light extraction pattern, the light extraction pattern disposed at the emission region of each of the plurality of subpixels and including a plurality of concave portions; and a light emitting device layer on the light extraction pattern of each of the plurality of subpixels. The emission region of each of the plurality of subpixels includes a reference point disposed at a concave portion of the plurality of concave portions. The light extraction pattern of each of the plurality of subpixels has a rotation angle with respect to the reference point.

20 Claims, 7 Drawing Sheets

140: 140a, 140b, 140c, 140d

ORGANIC LIGHT EMITTING DISPLAY APPARATUS

CROSS-REFERENCE TO RELATED APPLICATIONS

This application claims priority to Korean Patent Application No. 10-2022-0188341 filed on Dec. 29, 2022 in the Republic of Korea, the entire contents of which is hereby expressly incorporated by reference into the present application.

BACKGROUND

Technical Field

The present disclosure relates to an organic light emitting display apparatus capable of increasing internal light extraction efficiency and reducing reflectivity to external light.

Discussion of the Related Art

An organic light emitting display apparatus has come to be widely used for various applications because the organic light emitting display apparatus has a high response speed and has low power consumption. Further, unlike a liquid crystal display device, the organic light emitting display apparatus is a self-emissive display apparatus and does not require a separate light source such as a back light unit (BLU). Thus, the organic light emitting display apparatus has advantages in a viewing angle, whereby the organic light emitting display apparatus is quickly gaining momentum to be a next generation flat panel display apparatus in various display field.

The organic light emitting display apparatus displays an image through light emission of a light emitting device layer that includes an emission layer interposed between two electrodes.

Meanwhile, since some of the light emitted from the emission layer is not emitted to the outside due to a total reflection at an interface between the emission layer and the electrodes and/or a total reflection at an interface between the substrate and an air layer, a light extraction efficiency can be reduced. Accordingly, in the organic light emitting display apparatus, research towards improving brightness and overcoming low light extraction efficiency, and reducing power consumption is ongoing.

SUMMARY OF THE DISCLOSURE

Accordingly, the present disclosure is directed to providing an organic light emitting display apparatus that substantially obviates one or more problems due to limitations and disadvantages of the related art.

An aspect of the present disclosure is to provide an organic light emitting display apparatus that can enhance light extraction efficiency of light that is emitted from an emission layer.

Another aspect of the present disclosure is to provide an organic light emitting display apparatus in which a black visibility characteristic or a black color (or black rising) phenomenon caused by the reflection of external light can be reduced and the occurrence of rainbow Mura and circular ring Mura can be minimized or reduced.

The objects of the present disclosure are not limited to the aforesaid, but other objects not described herein will be clearly understood by those skilled in the art from descriptions below.

To achieve these and other aspects of the inventive concepts of the present disclosure, as embodied and broadly described herein, in one or more aspects, an organic light emitting display apparatus includes a plurality of pixels each including a plurality of subpixels having emission regions on a substrate, a planarization layer including a light extraction pattern which is at the emission region of each of the plurality of subpixels and includes a plurality of concave portions, and a light emitting device layer on the light extraction pattern, the light extraction pattern at each of the plurality of subpixels includes a structure which has rotated by different angles with respect to a reference point or reference line within a corresponding emission region.

In one or more aspects, an organic light emitting display apparatus includes a plurality of pixels each including first to fourth subpixels having emission regions on a substrate, a planarization layer including a light extraction pattern which is at the emission region of each of the first to fourth subpixels and includes a convex portion and a plurality of concave portions, and a light emitting device layer on the light extraction pattern, the light extraction pattern at each of the first to fourth subpixels can include a structure which has rotated with respect to a reference point or reference line within a corresponding emission region, and/or the number of concave portions at the light extraction patterns of the first to fourth subpixels is different from each other, and/or the light extraction pattern at a subpixel including a largest number of concave portions among the plurality of subpixels has a smallest rotation angle.

Specific details according to various examples of the present specification other than the means for solving the above-mentioned problems are included in the description and drawings below.

An organic light emitting display apparatus according to the present disclosure can enhance the light extraction efficiency of light emitted from an organic emission layer, and thus, can implement high efficiency and high luminance to extend a lifetime of the organic emission layer and can decrease power consumption, thereby implementing low power.

Moreover, in an organic light emitting display apparatus according to the present disclosure, a black visibility characteristic or a black color (or black rising) phenomenon caused by the reflection of external light can be reduced, and the occurrence of rainbow Mura and circular ring Mura can be minimized or reduced, thereby implementing true black in a non-driving or off state.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure and together with the description serve to explain principles of the disclosure.

DETAILED DESCRIPTION OF THE EMBODIMENTS

Figure 1:
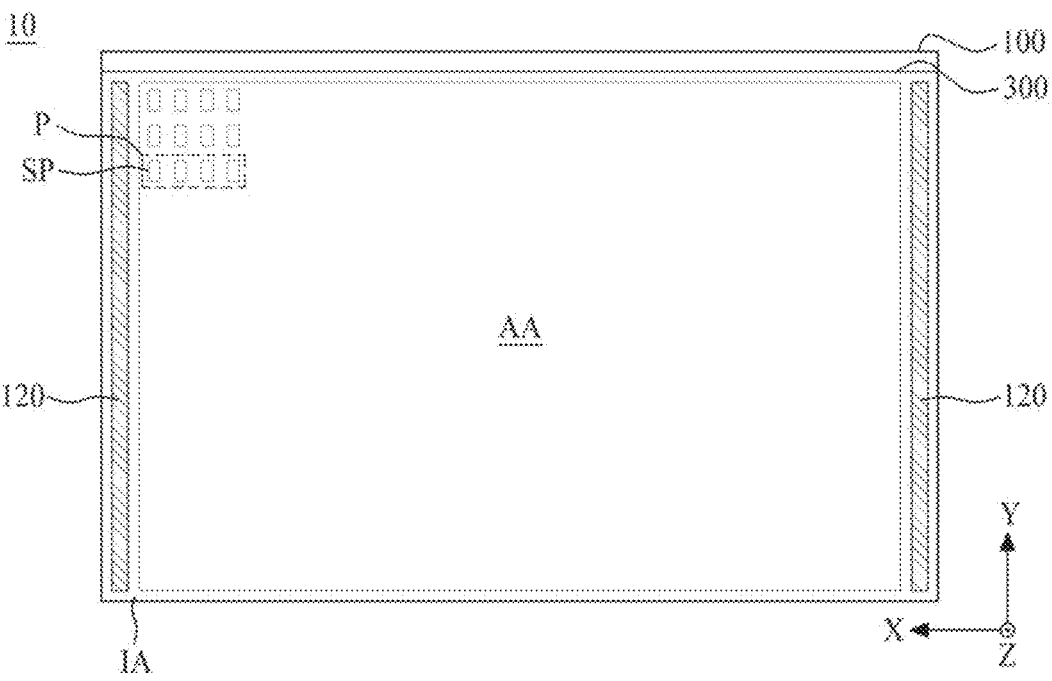
FIG. 1 is a diagram for describing an organic light emitting display apparatus according to an embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', 'include', etc. described in the present disclosure are used, another part can be added unless 'only-' is used. The terms in a singular form can include plural forms unless noted to the contrary.

In construing an element, the element is construed as including an error range although there is no explicit description.

In describing a positional relationship, for example, when a position relation between two parts is described as 'on', 'over', 'under', and 'next', one or more other parts can be disposed between the two parts unless a more limiting term, such as "just" or "direct(ly)" is used.

Spatially relative terms, such as "below," "beneath," "lower," "above," "upper," and the like, can be used to easily describe the relationship of one element or elements and another element or elements as illustrated in the drawings.

Spatially relative terms can be understood as terms including different directions of the device in use or operation, in addition to the direction illustrated in the drawings. For example, when the device in the drawings is turned over, elements described as "below" or "beneath" of other elements can be placed "above" of other elements. Thus, the exemplary term "below" or "beneath" can include both a downward direction and an upward direction.

It will be understood that, although the terms "first", "second", and the like can be used herein to describe various elements, these elements should not be limited by these terms and may not define order or sequence. These terms are only used to distinguish one element from another and may not define any order. For example, a first element could be termed a second element, and, similarly, a second element could be termed a first element, without departing from the scope of the present disclosure.

In describing elements of the present disclosure, the terms "first", "second", "A", "B", "(a)", "(b)", etc. can be used. These terms are intended to identify the corresponding elements from the other elements, and basis, order, or number of the corresponding elements should not be limited by these terms. The expression that an element or a layer is "connected", "coupled" or "adhered" to another element or layer means the element or layer can not only be directly connected or adhered to another element or layer, but also be indirectly connected or adhered to another element or layer with one or more intervening elements or layers "disposed" or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other and can be variously inter-operated with each other and driven technically as those skilled in the art can sufficiently understand. The embodiments of the present disclosure can be carried out independently from each other or can be carried out together in a co-dependent relationship.

Hereinafter, embodiments of the present disclosure will be described in detail with reference to the accompanying drawings. For convenience of description, a scale of each of elements shown in the accompanying drawings differs from a real scale, and thus, is not limited to a scale shown in the drawings. All components of each organic light emitting display apparatus according to all embodiments of the present disclosure are operatively coupled and configured.

FIG. 1 is a diagram for describing an organic light emitting display apparatus according to an embodiment of the present disclosure.

Referring to FIG. 1, the organic light emitting display apparatus according to an embodiment of the present disclosure can comprise a display panel 10 including a substrate 100 and a counter substrate 300 bonded to each other.

The display panel 10 or the substrate 100 includes a thin film transistor, and the substrate 100 can be a transparent glass substrate or a transparent plastic substrate. The display panel 10 or the substrate 100 can include a display area AA and a non-display area IA.

The display area AA is an area for displaying an image. The display area AA can be a pixel array area, an active area, a pixel array portion, or a screen. The display area AA can include a plurality of pixels P.

The plurality of pixels P can be disposed along a first direction X and a second direction Y crossing the first direction X. The plurality of pixels P can each be defined as a unit area from which light is actually emitted. Each of the plurality of pixels P can include a plurality of adjacent subpixels SP. For example, the first direction X can be a first lengthwise direction, a long-side lengthwise direction, a widthwise direction, or a first horizontal direction of the substrate 100. The second direction Y can be a second lengthwise direction, a short-side lengthwise direction, a lengthwise direction, a second horizontal direction, or a vertical direction of the substrate 100.

The non-display area IA is an area in which an image is not displayed. The non-display area IA can be a peripheral circuit area, a signal supply area, a non-active area, or a bezel area. The non-display area IA can be configured to surround the display area AA. The display panel 10 or substrate 100 can further include a peripheral circuit portion 120 disposed at the non-display area IA. The peripheral circuit portion 120 can include a gate driving circuit connected with a plurality of subpixels SP.

The counter substrate (or opposite substrate) 300 can be configured to overlap the display area AA. The counter substrate 300 can be disposed to be opposite-bonded to the substrate 100 by an adhesive member (or a transparent adhesive), or can be provided as a type where an organic material or an inorganic material is stacked on the substrate 100. The counter substrate 300 can be an upper substrate, a second substrate, or an encapsulation substrate and can encapsulate the substrate 100.

Figure 2:
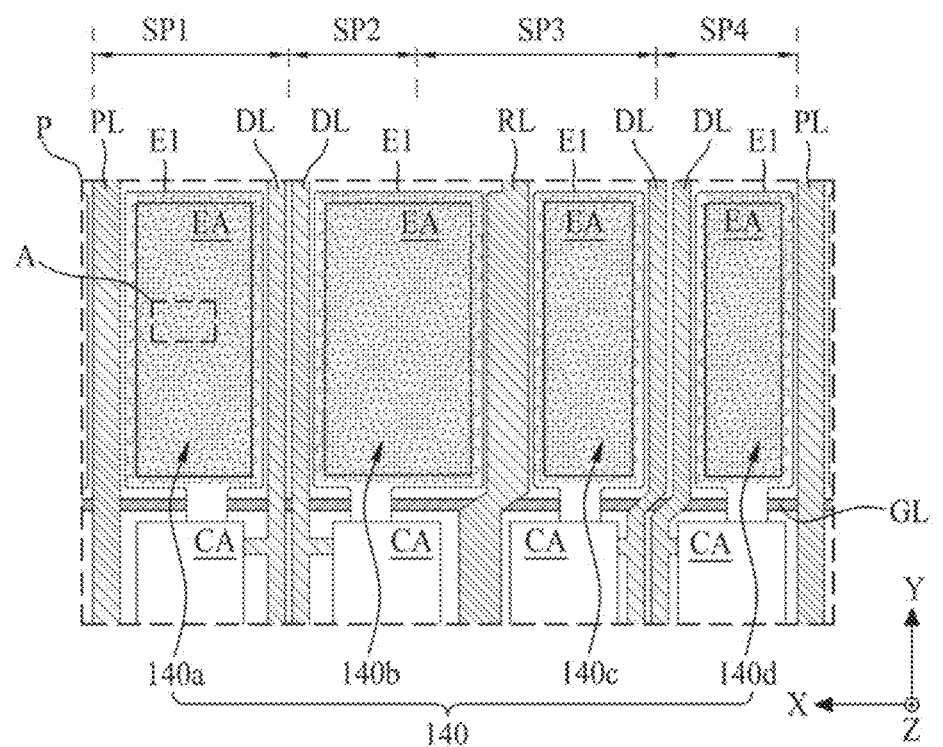
FIG. 2 is a plan view illustrating a plan structure of a pixel shown in FIG. 1.

FIG. 2 is a plan view illustrating a plan structure of a pixel shown in FIG. 1.

Referring to FIGS. 1 and 2, in the organic light emitting display apparatus (or the organic light emitting display panel) according to an embodiment of the present disclosure, each of the plurality of pixels P can include four subpixels SP1, SP2, SP3, and SP4. But embodiments of the present disclosure are not limited thereto, and any number of subpixels can be used.

Each of the plurality of pixels P according to an embodiment can include the first to fourth subpixels SP1, SP2, SP3, and SP4 adjacent to each other along the first direction X. For example, each of the plurality of pixels P can include a first subpixel SP1 of red, a second subpixel SP2 of white, a third subpixel SP3 of green, and a fourth subpixel SP4 of blue, but embodiments according to present disclosure are not limited thereto, as other colors or different combination of colors can be assigned to the first to fourth subpixels SP1, SP2, SP3 and SP4. Each of the first to fourth subpixels SP1, SP2, SP3, and SP4 can be configured to have the same size (or area) with each other, different sizes (or areas) from each other, or various combinations of same and different sizes (areas).

Each of the first to fourth subpixels SP1, SP2, SP3, and SP4 can include an emission area EA and a circuit area CA. The emission area EA can be disposed on one side (or an upper side) of a subpixel area for each of the first to fourth subpixels SP1, SP2, SP3 and SP4. The emission area EA of each of the first to fourth subpixels SP1, SP2, SP3, and SP4 can have different sizes (or areas) from each other. But embodiments of the present disclosure are not limited thereto, and the emission areas EA of one or more of the first to fourth subpixels SP1, SP2, SP3, and SP4 can be the same. Further, the emission area EA can be an opening region or a light emitting region of the one or more of the first to fourth subpixels SP1, SP2, SP3, and SP4.

The emission area EA of each of the first to fourth subpixels SP1, SP2, SP3, and SP4 can have different sizes (or areas) from each other along the first direction X. According to an embodiment of the present disclosure, in the emission area EA of each of the first to fourth subpixels SP1, SP2, SP3, and SP4, the emission area EA of the second subpixel SP2 can have the largest size, the emission area EA of the fourth subpixel SP4 can have the smallest size, the emission area EA of the first subpixel SP1 can be a smaller than the emission area EA of the second subpixel SP2, and the emission area EA of the first subpixel SP1 can be a larger than the emission area EA of each of the third and fourth subpixels SP3 and SP4. Moreover, the emission area EA of the third subpixel SP3 can have a larger size than the emission area EA of the fourth subpixel SP4. However, embodiments according to present disclosure are not limited thereto.

The circuit area CA of each of the first to fourth subpixels SP1, SP2, SP3, and SP4 can be spatially separated from the emission area EA within the subpixel area SPA. For example, the circuit area CA can be disposed at the other side (or a lower side) of the subpixel area SPA, but embodiments according to present disclosure are not limited thereto. For example, at least a portion of the circuit area CA can overlap the emission area EA within the subpixel area SPA. For example, the circuit area CA can overlap an entire emission area EA within the subpixel area SPA or can be disposed below (or under) the emission area EA within the subpixel area SPA. For example, the circuit area CA can be a non-emission area or a non-opening region.

Each of the plurality of pixels P according to another embodiment can further include a light transmitting portion (or a transparent portion) disposed around at least one of the emission area EA and the circuit area CA of each of the first to fourth subpixels SP1, SP2, SP3, and SP4. For example, each of the plurality of pixels P can include an emission area for subpixel corresponding to each of the plurality of subpixels SP1, SP2, SP3, and SP4, and the light transmitting portion (or a transparent portion) disposed around each of the plurality of subpixels SP1, SP2, SP3, and SP4, in this case, the organic light emitting display apparatus can implement a transparent light emitting display apparatus due to light transmission of the light transmitting portion.

Two data lines DL extending in parallel to each other along the second direction Y can be disposed between the first subpixel SP1 and the second subpixel SP2 and between the third subpixel SP3 and the fourth subpixel SP4, respectively. A gate line GL extending along the first direction X can be disposed between the emission area EA and the circuit area CA in each of the first to fourth subpixels SP1, SP2, SP3, and SP4. A pixel power line PL extending along the second direction Y can be disposed at one side of the first subpixel SP1 or the fourth subpixel SP4. A reference voltage line RL extending along the second direction Y can be disposed between the second subpixel SP2 and the third subpixel SP3. The reference voltage line RL can be used as a sensing line for externally sensing a variation in characteristics of a driving thin film transistor disposed in the circuit area CA of the pixel P and/or a variation in characteristics of a light emitting device layer disposed at the circuit area CA in a sensing driving mode of the pixel P.

Figure 3:
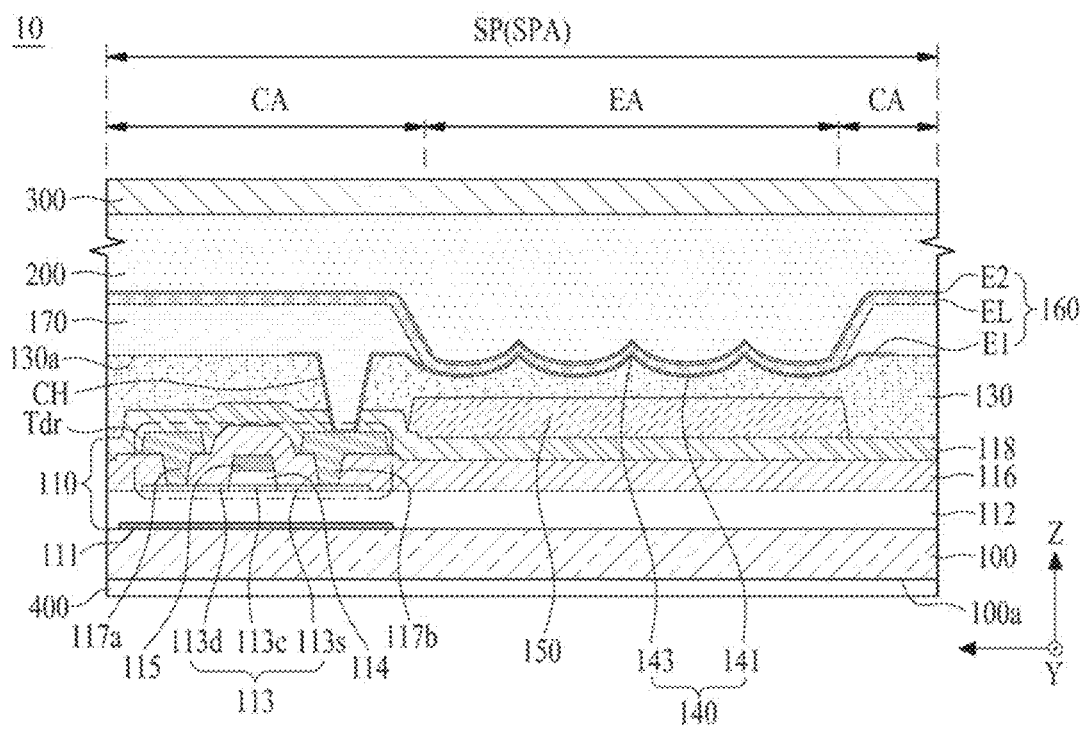
FIG. 3 is a cross-sectional view illustrating a cross-sectional structure of one subpixel according to an embodiment of the present disclosure.

FIG. 3 is a cross-sectional view illustrating a cross-sectional structure of one subpixel according to an embodiment of the present disclosure.

Referring to FIGS. 2 and 3, the organic light emitting display apparatus according to an embodiment of the present disclosure can comprise a substrate 100, an encapsulation portion 200, and a counter substrate 300. For example, the organic light emitting display apparatus or the display panel 10 according to an embodiment of the present disclosure can comprise a substrate 100, an encapsulation portion 200, and a counter substrate 300.

The display panel 10 or the substrate 100 can include a thin film transistor, and the substrate 100 can be a first substrate, a base substrate, a lower substrate, a transparent glass substrate, a transparent plastic substrate, or a base member. But embodiments of the present disclosure are not limited thereto.

The display panel 10 or the substrate 100 can include a pixel circuit layer 110, a planarization layer 130, and a light emitting device layer 160. The pixel circuit layer 110 can include a buffer layer 112, a pixel circuit, and a protection layer 118.

The buffer layer 112 can be disposed at an entirety of a surface facing a first surface (or a front surface) 100a of the substrate 100. The buffer layer 112 can prevent or at least reduce materials contained in the substrate 100 from spreading to a transistor layer during a high-temperature process in the manufacturing of the thin film transistor, or can prevent external water or moisture from permeating into the light emitting device layer 160. Optionally, depending on the case, the buffer layer 112 can be omitted.

The pixel circuit can include a driving thin film transistor Tdr disposed at a circuit area CA of each subpixel SP (or each subpixel areas SPA). The driving thin film transistor Tdr can include an active layer 113, a gate insulating layer 114, a gate electrode 115, an interlayer insulating layer 116, a drain electrode 117a, and a source electrode 117b.

The active layer 113 can be configured with a semiconductor material based on any one of amorphous silicon, polycrystalline silicon, oxide, and organic materials. But embodiments of the present disclosure are not limited thereto. The active layer 113 can include a channel region 113c, a drain region 113d, and a source region 113s.

The gate insulating layer 114 can be formed as an island shape over the channel region 113c of the active layer 113, or can be formed over the entire front surface of the buffer layer 112 or the substrate 100 including the active layer 113.

The gate electrode 115 can be disposed over the gate insulating layer 114 to overlap a channel region 113c of an active layer 113.

The interlayer insulating layer 116 can be formed over the gate electrode 115, and a drain region 113d and a source region 113s of the active layer 113. The interlayer insulating layer 116 can be formed at an entire front surface of the buffer layer 112 or the substrate 100. For example, the interlayer insulating layer 116 can include an inorganic material or an organic material.

The drain electrode 117a can be disposed over the interlayer insulating layer 116 to be electrically connected to the drain region 113d of the active layer 113. The source electrode 117b can be disposed over the interlayer insulating layer 116 to be electrically connected to the source region 113s of the active layer 113.

The pixel circuit can further include at least one capacitor and at least one switching thin film transistors which are disposed at the circuit area CA together with the driving thin film transistor Tdr.

The organic light emitting display apparatus according to an embodiment of the present disclosure can further include a light shielding layer 111 provided below (or under) at least one active layer 113 of the driving thin film transistor Tdr, a first switching thin film transistor, and a second switching thin film transistor. The light shielding layer 111 can be configured to reduce or prevent a change in a threshold voltage of the thin film transistor caused by external light.

The protection layer 118 can be configured over the pixel circuit. For example, the protection layer 118 can be configured to surround the drain electrode 117a and the source electrode 117b of the driving thin film transistor Tdr and the interlayer insulating layer 116. For example, the protection layer 118 can be formed of an inorganic insulating material and can be expressed or referred to in terms such as a passivation layer.

The planarization layer 130 can be provided over the pixel circuit layer 110. The planarization layer 130 can be formed at the entire display area AA and the remaining portions of the non-display area IA except the pad area. For example, the planarization layer 130 can include an extension portion (or expansion portion) extended or expanded from the display area AA to the remaining portions of the non-display area IA except the pad area. Accordingly, the planarization layer 130 can have a relatively large size than the display area AA.

The planarization layer 130 according to an embodiment can be formed to have a relatively large thickness so that the planarization layer 130 can provide a planarized surface 130a over the pixel circuit layer 110. For example, the planarization layer 130 can be formed of an organic material such as one of photo acrylic, benzocyclobutene, polyimide, and fluorine resin, or the like. But embodiments of the present disclosure are not limited thereto.

The planarization layer 130 can include a light extraction pattern 140 disposed at each subpixel SP. According to an embodiment of the present disclosure, the light extraction pattern 140 can be formed at the planarization layer 130 to overlap the emission area EA defined in the subpixel area SPA of each subpixel SP. According to another embodiment, the light extraction pattern 140 can be formed at an entire planarization layer 130.

The light extraction pattern 140 can be formed at the planarization layer 130 to have a curved portion (or non-flat portion) or a curved shape (or an uneven shape). The light extraction pattern 140 can have a size larger than the emission area EA. For example, the light extraction pattern 140 can be a light extraction pattern, a light extraction pattern portion, a curved pattern portion, an uneven pattern portion, a micro lens, or a light scattering portion. But embodiments of the present disclosure are not limited thereto.

The light extraction pattern 140 according to an embodiment can include a plurality of concave portions 141, and a convex portion 143 disposed around each of the plurality of concave portions 141. But embodiments of the present disclosure are not limited thereto. For example, a level portion or a flat portion can also be present in the light extraction pattern 140, and such a level portion or a flat portion can be located between adjacent concave portions 141, adjacent convex portions 143 or between a concave portion 141 and a convex portion 143.

Each of the plurality of concave portions 141 can be implemented to be concave from the upper surface (or a flat surface) 130a of the planarization layer 130. The plurality of concave portions 141 can have a same height with respect to the upper surface 130a of the planarization layer 130, but some of the plurality of concave portions 141 can have different heights or depths. For example, a bottom surface of each of the plurality of concave portions 141 can be positioned between the upper surface 130a of the planarization layer 130 and the substrate 100.

The convex portion 143 can be formed to be connected to each other between the plurality of concave portions 141. The convex portion 143 can be provided at the planarization layer 130 that overlaps the emission area EA to have a shape that can maximize an external extraction efficiency of light generated from the subpixel SP based on an effective emission area of the light emitting device layer 160. The convex portion 143 can change a propagation path of light emitted from the light emitting device layer 160 toward the light extraction surface 100a and extracts the light totally reflected within the light emitting device layer 160 toward the light extraction surface 100a, and thus, degradation of the light extraction efficiency caused by the light which is trapped within the light emitting device layer 160 can be prevented or minimized.

A top portion of the convex portion 143 according to an embodiment can be adjacent to the light emitting device layer 160 and can have a sharp structure and a convex curved shape, so as to increase the light extraction efficiency. For example, the top portion of the convex portion 143 can include a dome or bell structure having a convex cross-sectional shape. But embodiments of the present disclosure are not limited thereto. For example, the top portion of the convex portion 143, in addition to being an apex having the sharp structure, can have a rounded structure, a level structure, a flat structure or a combination of one or more of the sharp structure, the rounded structure, the level structure and the flat structure.

The convex portion 143 according to an embodiment can include an inclined portion having a curved shape between a bottom portion and the top portion (or peak portion). The inclined portion of the convex portion 143 can form or configure the concave portion 141. For example, the inclined portion of the convex portion 143 can be an inclined surface or a curved portion. The inclined portion of the convex portion 143 according to an embodiment can have a cross-sectional structure having a Gaussian curve. In this case, the inclined portion of the convex portion 143 can have a tangent slope which increases progressively from the bottom portion to the top portion, and then decreases progressively. But embodiments of the present disclosure are not limited thereto. For example, the inclined portion of the convex portion 143 can be a straight line curve, can include irregular shapes or can have a vertical side. When the inclined surface is vertical, the light extraction pattern 140 can have a square wave profile in a cross sectional view.

According to an embodiment of the present disclosure, the light extraction pattern 140 at one or more subpixel of the plurality of subpixels SP1, SP2, SP3, and SP4 can have a structure which has rotated with respect to a reference point (or an arbitrary point, or an arbitrary reference point) of the emission region EA. For example, the light extraction pattern 140 at one or more subpixel of the plurality of subpixels SP1, SP2, SP3, and SP4 can have a structure which has rotated with respect to a center portion (or a center point) CP of each of the plurality of concave portions 141.

The light extraction pattern 140 according to an embodiment of the present disclosure can include first to fourth light extraction patterns 140a, 140b, 140c, and 140d.

The first light extraction pattern 140a can be disposed or configured at the first subpixel SP1 of each of the plurality of pixels P. The second light extraction pattern 140b can be disposed or configured at the second subpixel SP2 of each of the plurality of pixels P. The third light extraction pattern 140c can be disposed or configured at the third subpixel SP3 of each of the plurality of pixels P. The fourth light extraction pattern 140d can be disposed or configured at the fourth subpixel SP4 of each of the plurality of pixels P. For example, each of first to fourth light extraction patterns 140a, 140b, 140c, and 140d can be rotated or reversely rotated by different angles with respect to a reference point of a corresponding emission region EA or a center portion CP of one concave portion 141. Accordingly, the light extraction pattern 140 configured at each of the subpixels SP1, SP2, SP3, and SP4 of each of the plurality of pixels P can be rotated or reversely rotated by different angles.

The light emitting device layer 160 can be disposed on (or over) the light extraction pattern 140 overlapping the emission area EA of each subpixel SP. The light emitting device layer 160 according to an embodiment can include a first electrode E1, an emission layer EL, and a second electrode E2. For example, the first electrode E1, the emission layer EL, and the second electrode E2 can be configured to emit the light toward the substrate 100 according to a bottom emission type. But embodiments of the present disclosure are not limited thereto.

The first electrode E1 can be formed on (or over) the planarization layer 130 of the subpixel area SPA, and can be electrically connected to a source electrode 117b (or a drain electrode 117a) of the driving thin film transistor Tdr. One end of the first electrode E1 which is close to the circuit area CA can be electrically connected to the source electrode 117b (or a drain electrode 117a) of the driving thin film transistor Tdr via an electrode contact hole CH provided at the planarization layer 130 and the protection layer 118.

The first electrode E1 can directly contact the light extraction pattern 140 and thus, can have a shape conforming to the shape of the light extraction pattern 140. As the first electrode E1 is formed (or deposited) over the planarization layer 130 to have a relatively small thickness, the first electrode E1 can have a surface morphology (or a second surface morphology) conforming to a surface morphology (or a first surface morphology) of the light extraction pattern 140 including the convex portion 143 and the plurality of concave portions 141. For example, the first electrode E1 is formed in a conformal shape based on the surface shape (morphology) of the light extraction pattern 140 by a deposition process of a transparent conductive material, whereby the first electrode E1 can have a cross-sectional structure whose shape is a same as or conforming to the light extraction pattern 140.

The emission layer EL can be formed on (or over) the first electrode E1 and can directly contact the first electrode E1. As the emission layer EL is formed (or deposited) on (or over) the first electrode E1 to have a relatively large thickness in comparison to the first electrode E1, the emission layer EL can have a surface morphology (or third surface morphology) which is equal or different from the surface morphology in each of the plurality of concave portions 141 and the convex portion 143 or the surface morphology of the first electrode E1. For example, the emission layer EL can be formed in a non-conformal shape which does not conform to the surface shape (or morphology) of the first electrode E1 by a deposition process, whereby the emission layer EL can have a cross-sectional structure whose shape can be different from the first electrode E1.

The emission layer EL according to an embodiment has a thickness that gradually increases toward the bottom surface of the convex portion 143 or the concave portion 141. For example, the emission layer EL can have the thinnest thickness at the inclined surface (or curved surface) between the convex portion 143 and the concave portion 141, but embodiments according to present disclosure are not limited thereto.

The emission layer EL according to an embodiment can include two or more organic emission layers to emit white light. As an example, the emission layer EL can include a first organic emission layer and a second organic emission layer to emit white light by mixing a first light and a second light. But embodiments of the present disclosure are not limited thereto. For example, the emission layer EL can emit an individual light of one of red, blue and green, or a combination thereof.

The second electrode E2 can be formed on (or over) the emission layer EL and can directly contact the emission layer EL. The second electrode E2 can be formed (or deposited) on (or over) the emission layer EL to have a relatively thin thickness compared to the emission layer EL. The second electrode E2 can be formed (or deposited) on (or over) the emission layer EL to have a relatively thin thickness, and thus can have a surface morphology corresponding to the surface morphology of the emission layer EL. For example, the second electrode E2 can be formed in a conformal shape corresponding to the surface shape (or morphology) of the emission layer EL by a deposition process, whereby the second electrode E2 can have a same cross-sectional structure as the emission layer EL and can have a cross-sectional structure whose shape can be different from the light extraction pattern 140.

The second electrode E2 according to an embodiment can include a metal material having a high reflectance to reflect the incident light emitted from the emission layer EL toward the substrate 100. For example, the second electrode E2 can include a single-layered structure or multi-layered structure of any one material selected from aluminum (Al), argentums or silver (Ag), molybdenum (Mo), aurum or gold (Au), magnesium (Mg), calcium (Ca), or barium (Ba), or alloy of two or more materials selected from aluminum (Al), argentums or silver (Ag), molybdenum (Mo), aurum or gold (Au), magnesium (Mg), calcium (Ca), or barium (Ba). The second electrode E2 can be a cathode electrode.

The traveling path of the light generated from the emission layer EL can change toward the light extraction surface (or a light emitting surface) by the concave portion 141 and/or the convex portion 143 of the light extraction portion 140, to thereby increase the external extraction efficiency of the light emitted from the emission layer EL.

The organic light emitting display apparatus according to an embodiment of the present disclosure can further include a bank layer 170. The bank layer 170 can be disposed on (or over) the planarization layer 130 and an edge portion of the first electrode E1. The bank layer 170 can be configured in a transparent material or an opaque material. For example, the bank layer 170 can be a transparent bank layer or a black bank layer. For example, the bank layer 170 can include a photosensitizer including a black pigment, in this case, the bank layer 170 can function as a light blocking member between adjacent subpixels SP. But embodiments of the present disclosure are not limited thereto.

The organic light emitting display apparatus or the display panel 10 according to an embodiment of the present disclosure can further include a color filter layer 150.

The color filter layer 150 can be disposed between the substrate 100 and the light extraction portion 140. The color filter layer 150 can be disposed between the substrate 100 and the light extraction portion 140 to overlap at least one emission area EA. The color filter layer 150 according to an embodiment can be disposed between the planarization layer 130 and the protection layer 118 to overlap with the emission area EA. The color filter layer 150 according to another embodiment can be disposed between the interlayer insulation layer 116 and the protection layer 118 to overlap with the emission area EA, or can be disposed between the substrate 100 and the interlayer insulation layer 116. But embodiments of the present disclosure are not limited thereto.

The color filter layer 150 can have a size which is greater or wider than the emission area EA. The color filter layer 150 can have a size which is greater than the emission area EA and smaller than the light extraction portion 140 of the planarization layer 130, but embodiments according to present disclosure are not necessarily limited to thereto, and the color filter layer 150 can have a size which is greater than the light extraction portion 140 of the planarization layer 130. For example, an edge portion of the color filter layer 150 can overlap the bank layer 170. For example, the color filter layer 150 can have a size which is greater than a size corresponding to an entire subpixel area SPA of each subpixel SP, thereby reducing light leakage between adjacent subpixels SP.

The color filter layer 150 can be configured to transmit only the wavelength of a color set in the subpixel SP. For example, as shown in FIG. 2, when one pixel P is configured with the first to fourth subpixels SP1, SP2, SP3, and SP4, the color filter layer 150 can include a red color filter disposed in the first subpixel SP1, a green color filter disposed in the third subpixel SP3, and a blue color filter disposed in the fourth subpixel SP4. The second subpixel SP2 can be without a color filter layer or can include a transparent material lacking color to compensate a step difference between adjacent subpixels, thereby emitting or transmitting white light.

The encapsulation portion 200 can be formed on (or over) the substrate 100 to surround the light emitting device layer 160. The encapsulation portion 200 can be formed on (or over) the second electrode E2. For example, the encapsulation portion 200 can surround the display area AA. The encapsulation portion 200 can protect the thin film transistor and the emission layer EL or the like from external impact and prevent oxygen or/and water (or moisture) and particles from being permeated into the emission layer EL.

The encapsulation portion 200 according to an embodiment can include a plurality of inorganic encapsulation layer. Furthermore, the encapsulation portion 200 can further include at least one organic encapsulation layer interposed between the plurality of inorganic encapsulation layer. The encapsulation portion 200 according to another embodiment can be changed to a filler surrounding (or completely surrounding) an entire display area AA. In this case, the counter substrate 300 can be bonded to the substrate 100 by using the filler. The filler can include a getter material that absorbs oxygen or/and water (or moisture) or the like.

The counter substrate 300 can be coupled to the encapsulation portion 200. The counter substrate 300 can be made of a plastic material, a glass material, or a metal material. But embodiments of the present disclosure are not limited thereto. For example, when the encapsulation portion 200 includes the plurality of inorganic encapsulation layers, the counter substrate 300 can be omitted.

Alternatively, when the encapsulation portion 200 is changed to the filler, the counter substrate 300 can be combined with the filler, in this case, the counter substrate 300 can be made of a plastic material, a glass material, or a metal material. But embodiments of the present disclosure are not limited thereto.

The organic light emitting display apparatus or display panel 10 according to an embodiment of the present disclosure can further include a polarizing member 400.

The polarizing member 400 can be configured to block the external light reflected by the light extracting portion 140 and the pixel circuit, or the like. For example, the polarizing member 400 can be a circular polarizing member or a circular polarizing film. But embodiments of the present disclosure are not limited thereto. The polarizing member 400 can be disposed on (or over) or coupled to the light extraction surface 100a of the substrate 100 by using a coupling member (or a transparent adhesive member). But embodiments of the present disclosure are not limited thereto.

As described above, the organic light emitting display apparatus or display panel 10 according to an embodiment of the present disclosure includes the light extracting portion 140 disposed or configured at the emission area EA of the subpixel SP, thereby improving light extraction efficiency by changing a path of light generated from the emission layer EL by the light extracting portion 140. Thus, it is possible to realize high efficiency and high luminance so that the lifespan of the emission layer can be extended, and low power consumption can be realized.

Figure 4:
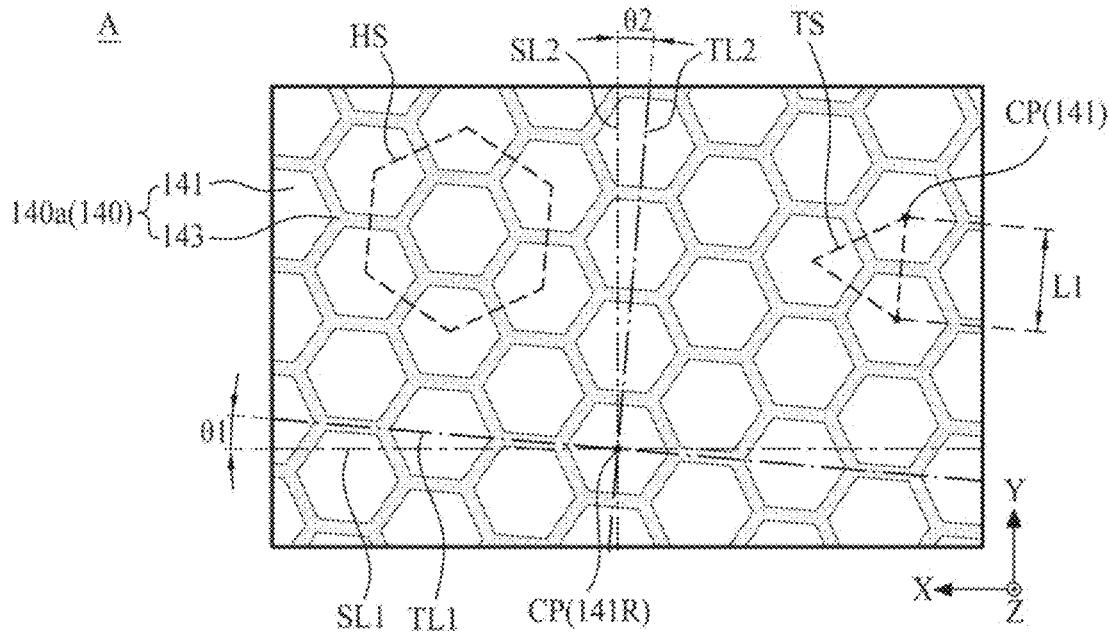
FIG. 4 is an enlarged view of a region 'A' illustrated in FIG. 2.

FIG. 4 is an enlarged view of a region 'A' illustrated in FIG. 2. FIG. 4 is a diagram for describing a planar structure of a rotation structure of a light extraction pattern according to an embodiment of the present disclosure.

Referring to FIGS. 2 and 4, in the light extraction pattern 140 according to the first embodiment of the present disclosure, each of the plurality of concave portions 141 can be disposed in parallel to have a predetermined interval along a first direction X and can be arranged to be staggered with one another along a second direction Y crossing the first direction X. For example, the plurality of concave portions 141 disposed along the second direction Y can be positioned or aligned at a zigzag line having a zigzag shape along the first direction X (or the second direction Y). Thus, the light extraction pattern 140 can include a larger number of concave portions 141 per unit area, thereby increasing the external extraction efficiency of the light emitted from the light emitting device layer 160. For example, the first direction X can be a first lengthwise direction, a long-side lengthwise direction, a widthwise direction, or a first horizontal direction of the substrate 100. The second direction Y can be a second lengthwise direction, a short-side lengthwise direction, a lengthwise direction, a second horizontal direction, or a vertical direction of the substrate 100.

According to an embodiment of the present disclosure, pitches (or intervals) L1 between a plurality of concave portions 141 disposed in each of first to fourth subpixels SP1 to SP4 configuring one pixel P can be equal to one another. The pitch L1 between the plurality of concave portions 141 can be a distance (or an interval) between the center portions of the two adjacent concave portions 141.

According to an embodiment of the present disclosure, a center portion CP of each of the adjacent three concave portions 141 can form a triangular shape TS. In addition, a center portion CP of six concave portions 141, which are disposed at a periphery of one concave portion 141 or surrounds one concave portion 141, can be connected with one another to one-dimensionally form a hexagonal shape HS. An outer periphery of each of the plurality of concave portions 141 can be disposed or can have in a honeycomb structure, a hexagonal structure, or a circular structure. But embodiments of the present disclosure are not limited thereto. For example, the shapes or structures of one or more of the plurality of concave portions can be other shapes such as triangular shape, and can be the same or different from each other. For example, the plurality of concave portions 141 can be mixtures of the various shapes or structures, or can simply be repeating units of the same shape.

In other embodiments of the present disclosure, sizes of the plurality of concave portions 141 can be the same, different or a mixture of same and different sizes. For example, sizes of the plurality of concave portions 141 arranged in one of the first direction X and the second direction Y can have the same size, but the sizes of the concave portions 141 arranged in the other of the first direction X and the second direction Y can be different from one another. For example, a first row of the plurality of concave portions 141 arranged in the first direction X can have the same size, and a second row of the plurality of concave portion separated from the first row in the second direction Y but arranged in the first direction X can have different sizes from those of the first row. Further, different sized concave portions 141 can alternate in both the first direction X and the second direction Y, so that the plurality of concave portions 141 having two or more sizes are used for the light extraction pattern 140. In various embodiments of the present disclosure, the plurality of concave portions 141 of different sizes and shapes can be used for the light extraction pattern 140.

The convex portion 143 can be formed to surround each of the plurality of concave portions 141. For example, the convex portion 143 can be configured to individually surround each of the plurality of concave portions 141. Accordingly, the planarization layer 130 overlapping the emission area EA can include a plurality of concave portions 141 surrounded by the convex portions 143. For example, the convex portion 143 surrounding one concave portion 141 can have a square shape, a honeycomb shape, or a circle shape in two-dimensions (or in a plan view) according to the arrangement structure of each of the plurality of concave portions 141. But embodiments of the present disclosure are not limited thereto.

The light extraction pattern 140 can be configured to rotate (or horizontally rotate) or reversely rotate (or horizontally and reversely rotate) by a rotation angle of greater than 0 degrees and less than 60 degrees with respect to an arbitrary reference point, within an emission region EA (or a subpixel area) of each of the first to fourth subpixels SP1, SP2, SP3, and SP4. For example, a rotation angle of the light extraction pattern 140 can be set to within a range of greater than 0 degrees and less than 60 degrees. For example, the arbitrary reference point can be an arbitrary position within the emission region EA (or a subpixel area) of each of the first to fourth subpixels SP1, SP2, SP3, and SP4 in the pixel P, or can be a center portion CP of any one of the plurality of concave portions 141.

According to an embodiment of the present disclosure, when the concave portion 141 has a planar structure having a hexagonal shape (or a honeycomb shape), a case where the light extraction pattern 140 rotates by 60 degrees, 120 degrees, 180 degrees, 240 degrees, 300 degrees, or 360 degrees with respect to the arbitrary reference point can be configured to be equal to a case where the light extraction pattern 140 does not rotate with respect to the arbitrary reference point. Accordingly, when the concave portion 141 has a planar structure having a hexagonal shape (or a honeycomb shape), a rotation angle of the light extraction pattern 140 can be set to greater than 0 degrees and less than 60 degrees.

According to a rotation structure (or rotation arrangement) of the light extraction pattern 140, when a center portion CP of an arbitrary reference concave portion 141R of a plurality of concave portions 141 disposed along a first direction X is positioned at or aligned with a first straight line SL1 parallel to the first direction X, a center portion CP of each of a plurality of other concave portions 141 adjacent to the reference concave portion 141R can be not positioned at or aligned with the first straight line SL1.

According to a rotation structure (or rotation arrangement) of the light extraction pattern 140, when a center portion CP of an arbitrary reference concave portion 141R of a plurality of concave portions 141 disposed along a second direction Y is positioned at or aligned with a second straight line SL2 parallel to the second direction Y, a center portion CP of each of a plurality of other concave portions 141 adjacent to the reference concave portion 141R may not be positioned at or aligned with the second straight line SL2.

According to an embodiment of the present disclosure, the center portion CP of each of the plurality of concave portions 141 disposed at the first direction X can be positioned or aligned at the first tilt line TL1 intersecting with the first straight line SL1. Furthermore, the center portion CP of each of the plurality of concave portions 141 disposed at the second direction Y can be positioned or aligned at the second tilt line TL2 intersecting with the second straight line SL2.

The first tilt line TL1 can be sloped or inclined (or rotated) by a first angle $\theta 1$, which is greater than 0 degrees and less than 60 degrees, from the first straight line SL1. For example, the first angle $\theta 1$ can be greater than 0 degrees and less than 60 degrees. The first tilt line TL1 according to an embodiment of the present disclosure can be sloped or inclined from the first straight line SL1 and can pass through a center portion CP of rotated concave portions 141, and thus, the first tilt line TL1 can be a first center connection line or a first center extension line. The first tilt line TL1 according to another embodiment of the present disclosure can be sloped or inclined from the first straight line SL1 and can pass through ends of rotated concave portions 141, and thus, the first tilt line TL1 can be a first end connection line or a first end extension line.

According to an embodiment of the present disclosure, when the plurality of concave portions 141 are arranged in a honeycomb structure, the first tilt line TL1 according to an embodiment of the present disclosure can be sloped or inclined from the first straight line SL1 and can pass through two vertexes facing each other and a center portion CP at each of the plurality of concave portions 141. Furthermore, the first tilt line TL1 according to another embodiment of the present disclosure can be sloped or inclined from the first straight line SL1 and can pass through any one of first to sixth sides of each of the plurality of concave portions 141. For example, an angle between the first tilt line TL1 and a side intersecting with the first tilt line TL1 among the first to sixth sides of each of the plurality of concave portions 141 can be 60 degrees.

The second tilt line TL2 can be sloped or inclined by a second angle $\theta 2$, which is greater than 0 degrees and less than 60 degrees, from a second straight line SL2. For example, the first angle $\theta 1$ can be greater than 0 degrees and less than 60 degrees. The second angle $\theta 2$ can be equal to a first angle $\theta 1$. The second tilt line TL2 according to an embodiment of the present disclosure can be sloped or inclined from the second straight line SL2 and can pass through a center portion CP of rotated concave portions 141, and thus, the second tilt line TL2 can be a second center connection line or a second center extension line. The second tilt line TL1 according to another embodiment of the present disclosure can be sloped or inclined from the second straight line SL2 and can pass through ends of rotated concave portions 141, and thus, the second tilt line TL2 can be a second end connection line or a second end extension line.

According to an embodiment of the present disclosure, when the plurality of concave portions 141 are arranged in a honeycomb structure, the second tilt line TL2 according to an embodiment of the present disclosure can be sloped or inclined from the second straight line SL2 and can pass through the center portion CP and a center of each of two sides facing each other in each of the plurality of concave portions 141. Furthermore, the second tilt line TL2 according to another embodiment of the present disclosure can be sloped or inclined from the second straight line SL2 and can pass through one of first to sixth vertexes of each of the plurality of concave portions 141. For example, an angle between the second tilt line TL2 and a side intersecting with the second tilt line TL2 among the first to sixth sides of each of the plurality of concave portions 141 can be 30 degrees or 90 degrees.

According to an embodiment of the present disclosure, external light incident on the light extraction pattern 140 which has rotated about the arbitrary reference point can be reflected by the rotated light extraction pattern 140. The rotated light extraction pattern 140 can change a diffraction path of incident light to a vertical direction and can generate a diffraction pattern (or a diffraction pattern distribution) having maximum intensity in a specific order instead of a $0^{th}$ diffraction order, and thus, diffraction patterns (or diffraction pattern distributions) occurring due to the constructive interference of reflection light reflected from the light extraction pattern 140 can be offset or minimized. Constructive interference between diffraction patterns (or diffraction pattern distributions) can be offset due to the irregularity or randomness of a rotation angle of the light extraction pattern 140.

As described above, the organic light emitting display apparatus according to an embodiment of the present disclosure can include the light extraction pattern 140 which has rotated about an arbitrary reference point, and thus, can prevent or minimize the occurrence of radial-shaped rainbow Mura and radial-shaped circular ring Mura of reflected light caused by the irregularity or randomness of a diffraction pattern of the reflected light based on a rotation angle of the light extraction pattern 140. Accordingly, a black visibility characteristic or a black color (or black rising) phenomenon caused by the reflection of external light can be reduced in a non-driving or off state, and the occurrence of rainbow Mura and circular ring Mura can be minimized or reduced, thereby implementing true black.

According to an embodiment of the present disclosure, external light incident on the light extraction pattern 140 can decrease more in output angle than an incident angle as a refractive index of a planarization layer increases, and thus, the amount of light reflected twice from the light extraction pattern 140 or a convex portion 143 can increase, whereby a reflectance (or the amount of reflection) of external light can increase to increase a black color (or black rising) phenomenon or a reflection visibility characteristic can be reduced. For example, when the refractive index of the planarization layer where the light extraction pattern 140 is formed is 1.57 or more, a black color (or black rising) phenomenon can increase. Accordingly, the planarization layer according to an embodiment of the present disclosure can be formed to have a refractive index of less than 1.57 or have a refractive index similar to that of the substrate 100, and thus, an output angle can be greater than an incident angle of external light incident on the light extraction pattern 140, thereby decreasing a reflectance (or the amount of reflection) of external light to reduce a black color (or black rising) phenomenon or improve a reflection visibility characteristic.

Figure 5:
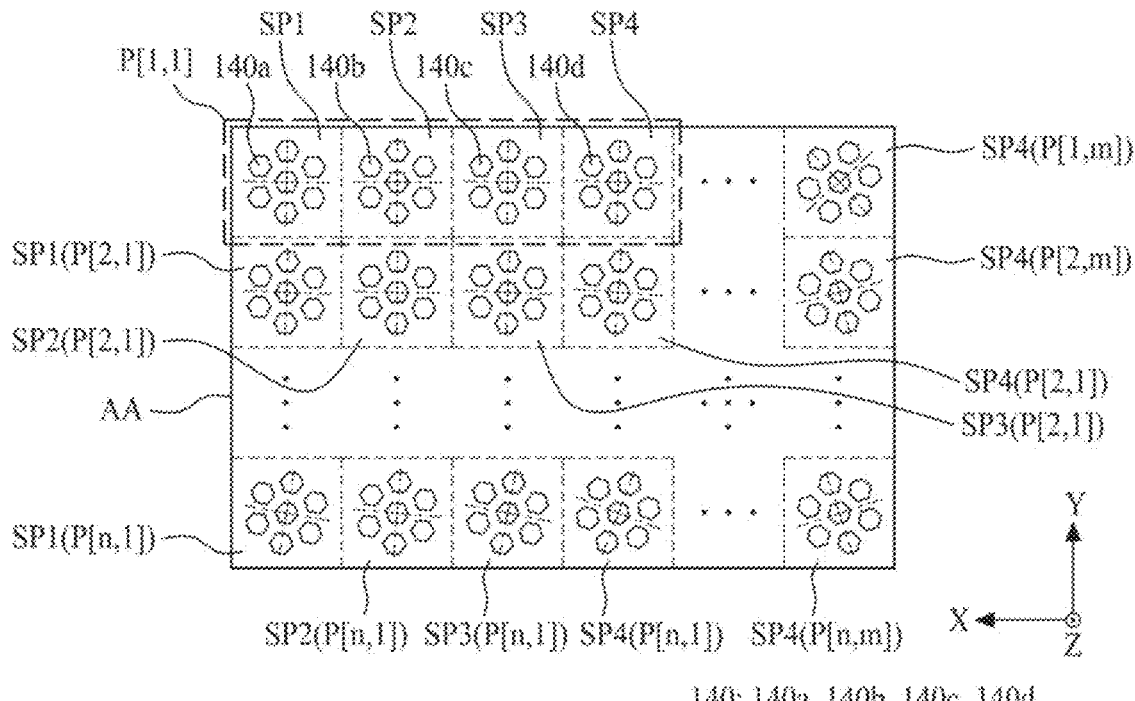
FIG. 5 is a diagram illustrating a rotation structure of a light extraction pattern according to a first embodiment of the present disclosure.

FIG. 5 is a diagram illustrating a rotation structure of a light extraction pattern 140 according to a first embodiment of the present disclosure.

Referring to FIG. 5, in an organic light emitting display apparatus according to an embodiment of the present disclosure, a display area AA can include a plurality of pixels P[1,1] to P[n,m] arranged in each of a first direction X and a second direction Y. Each of the plurality of pixels P[1,1] to P[n,m] can include first to fourth subpixels SP1, SP2, SP3, and SP4.

The light extraction pattern 140 can rotate by different angles (or rotation angles) with respect to the first to fourth subpixels SP1, SP2, SP3, and SP4 provided at each of the plurality of pixels P[1,1] to P[n,m]. For example, the light extraction pattern 140 can rotate by a rotation angle, which is greater than 0 degrees and less than 60 degrees, with respect to an arbitrary reference point within an emission region of each of the first to fourth subpixels SP1, SP2, SP3, and SP4. For example, the light extraction pattern 140 formed at each of the first to fourth subpixels SP1, SP2, SP3, and SP4 by pixel P units can rotate by different rotation angles. For example, the light extraction patterns 140 at one pixel P can have different rotation angles for each subpixel, and rotation angles of the light extraction patterns 140 of each subpixel can be different by pixel P units. For example, when the light extraction pattern 140 has a planar structure having a hexagonal shape (a honeycomb shape), some of the subpixel-based light extraction patterns 140 formed at the display area AA can have a same rotation angle, and the subpixel-based light extraction patterns 140 having a same rotation angle can be set irregularly or randomly at the display area AA, thereby decreasing or minimizing a circular ring Mura which occurs due to reflected light of external light reflected by the light extraction patterns 140 having a same rotation angle.

According to an embodiment of the present disclosure, even when rotation angles of light extraction patterns 140 of subpixels are equal to one another, a reflectance (or the amount of reflection) of subpixel-based external light occurring at the light extraction pattern 140 formed in each of the first to fourth subpixels SP1, SP2, SP3, and SP4 can increase as the number of concave portions 141 increases. Accordingly, a rotation angle of the light extraction pattern 140 of each subpixel within one pixel P can be set to be inversely proportional to a size (or an area) of each subpixel or the number (or a number ratio) of concave portions 141. For example, the light extraction pattern 140 of each subpixel within the one pixel P can have a rotation angle which decreases as a number ratio of concave portions 141 of each subpixel increases.

According to an embodiment of the present disclosure, even when rotation angles of light extraction patterns 140 of subpixels are equal to one another, a reflectance (or the amount of reflection) of subpixel-based external light occurring at the light extraction pattern 140 formed in each of the first to fourth subpixels SP1 to SP4 can increase as a light transmittance of each subpixel SP (or a color filter layer) increases. Accordingly, a rotation angle of the light extraction pattern 140 of each subpixel within one pixel P can be set to be inversely proportional to a subpixel-based light transmittance. For example, the light extraction pattern 140 of each subpixel within the one pixel P can have a rotation angle which decreases as the subpixel-based light transmittance increases.

According to an embodiment of the present disclosure, the light extraction patterns 140 of each subpixel within the one pixel P can have different rotation angles, based on one or more of a number ratio of concave portions 141 of each subpixel and a light transmittance of each subpixel. For example, in each of the plurality of pixels P[1,1] to P[n,m], a rotation angle of the light extraction pattern 140 formed at the first subpixel SP1 can be greater than a rotation angle of the light extraction pattern 140 formed in the second subpixel SP2, a rotation angle of the light extraction pattern 140 formed at the third subpixel SP3 can be greater than a rotation angle of the light extraction pattern 140 formed at each of the first and second subpixels SP1 and SP2, and a rotation angle of the light extraction pattern 140 formed at the fourth subpixel SP4 can be greater than a rotation angle of the light extraction pattern 140 formed at each of the first to third subpixels SP1, SP2, and SP3.

According to an embodiment of the present disclosure, in each of the plurality of pixels P[1,1] to P[n,m], the light extraction patterns 140 can have different rotation angles with respect to one of the first to fourth subpixels SP1 to SP4. For example, the light extraction patterns 140 can have different rotation angles with respect to the second subpixel SP2, but embodiments according to the present disclosure are not limited thereto. For example, in each of the plurality of pixels P[1,1] to P[n,m], the light extraction patterns 140 respectively provided at the first to fourth subpixels SP1 to SP4 can have different rotation angles, and the light extraction patterns 140 respectively provided at the first, third, and fourth subpixels SP1, SP3, and SP4 can have different rotation angles with respect to a rotation angle of the light extraction pattern 140 of the second subpixel SP2.

The light extraction pattern 140 according to the first embodiment of the present disclosure can include a first light extraction pattern 140a at the first subpixel SP1, a second light extraction pattern 140b at the second subpixel SP2, a third light extraction pattern 140c at the third subpixel SP3, and a fourth light extraction pattern 140d at the fourth subpixel SP4.

A second light extraction pattern 140b formed at the second subpixel SP2 of each of the plurality of pixels P[1,1] to P[n,m] can have a rotation angle which is greater than 0 degrees and less than 60 degrees. Rotation angles of second light extraction patterns 140b at two second subpixels SP2 adjacent to each other along one or more of a first direction X and a second direction Y can have an angle difference equal to a reference angle deviation corresponding to one of angles which are greater than 0 degrees and less than 60 degrees. For example, the rotation angles of the second light extraction patterns 140b at the two second subpixels SP2 adjacent to each other along one or more of the first direction X and the second direction Y can have a reference angle deviation (or a reference angle difference). For example, a rotation angle of the second light extraction pattern 140b at the second subpixel SP2 of a 1×1 pixel P[1,1] and a rotation angle of the second light extraction pattern 140b at the second subpixel SP2 of a 1×2 pixel P[1,2] can have the reference angle deviation therebetween.

According to an embodiment of the present disclosure, when the light extraction pattern 140 has a planar structure having a hexagonal shape (or a honeycomb shape) and the reference angle deviation is 1 degree, in rotation angles of the light extraction patterns 140, a same rotation angle can be repeated by a unit of 60 pixels (or 60 pixel units), and thus, circular ring Mura caused by the reflection of external light can occur by a unit of 60 pixels (or 60 pixel units). For example, when the reference angle deviation is 0.1 degrees, in the rotation angles of the light extraction patterns 140, a same rotation angle can be repeated by a unit of 60 pixels (or 60 pixel units), and thus, circular ring Mura caused by the reflection of external light can occur by a unit of 60 pixels (or 600 pixel units). Accordingly, the reference angle deviation can be set to one angle of angles of 0.1 degrees or more and 1 degree or less, but embodiments of the present disclosure are not limited thereto.

According to an embodiment of the present disclosure, rotation angles of second light extraction patterns 140b at two second subpixels SP2 adjacent to each other along one of the first direction X and the second direction Y can have different reference angle deviations. For example, a reference angle deviation of rotation angles of second light extraction patterns 140b at two second subpixels SP2 adjacent to each other along the first direction X can be 0.5 degrees, and a reference angle deviation of rotation angles of second light extraction patterns 140b at two second subpixels SP2 adjacent to each other along the second direction Y can be 0.7 degrees, but embodiments of the present disclosure are not limited thereto.

In each of the plurality of pixels P[1,1] to P[n,m], rotation angles of the light extraction patterns 140 respectively provided at the first, third, and fourth subpixels SP1, SP3, and SP4 can be set based on a number ratio of concave portions 141 formed in each of the first to fourth subpixels SP1, SP2, SP3, and SP4, a light transmittance of each of the first to fourth subpixels SP1, SP2, SP3, and SP4, and a reference angle deviation of the rotation angles of the light extraction patterns 140 of the second subpixel SP2.

A number ratio of concave portions 141 formed at each of the first to fourth subpixels SP1 to SP4 can be a ratio of the number of concave portions 141 of each subpixel to the total number of concave portions 141 formed at one pixel P. For example, the number of concave portions 141 of each subpixel can be proportional to a size (or an area) of each subpixel, and thus, the number of second subpixels SP2 can be largest, the number of first subpixels SP1 can be second large, the number of third subpixels SP3 can be third large, and the number of fourth subpixels SP4 can be smallest. For example, in a number ratio of concave portions 141 of each subpixel within one pixel P, the first subpixel SP1 can be 27.3%, the second subpixel SP2 can be 33%, the third subpixel SP3 can be 20.7%, and the fourth subpixel SP4 can be 19%, but embodiments of the present disclosure are not limited thereto.

A light transmittance of each of the first to fourth subpixels SP1, SP2, SP3, and SP4 can be a transmittance of the color filter layer. The first to fourth subpixels SP1, SP2, SP3, and SP4 can have different transmittances. For example, in a light transmittance of each subpixel within one pixel P, the first subpixel SP1 can be 60%, the second subpixel SP2 can be 100%, the third subpixel SP3 can be 74%, and the fourth subpixel SP4 can be 41%, but embodiments of the present disclosure are not limited thereto.

According to an embodiment of the present disclosure, because a red first subpixel SP1 and a green third subpixel SP3 are high in number ratio of concave portions 141, red reflected light and green reflected light of reflected lights of external light can increase, and thus, a sense of color of red, green, and yellow in reflected light can be recognized to be relatively high. The light extraction patterns 140 of each subpixel within one pixel P can have different rotation angles, based on a number ratio of concave portions 141 of each subpixel and a light transmittance of each subpixel. For example, the light extraction patterns 140 respectively provided at the first, third, and fourth subpixels SP1, SP3, and SP4 within one pixel P can have different rotation angles, based on a rotation angle of the second subpixel SP2 and a light transmittance and a number ratio of concave portions 141. Accordingly, a rotation angle of the light extraction pattern 140 of each subpixel within one pixel P can be set based on a number ratio of concave portions 141 of each subpixel and a light transmittance of each subpixel, and thus, a sense of color of red, green, and yellow in reflected light can be reduced or minimized.

In random angle ratio of the light extraction pattern 140 of each subpixel within one pixel P, the first subpixel SP1 can be 16.4%, the second subpixel SP2 can be 34%, the third subpixel SP3 can be 15.3%, and the fourth subpixel SP4 can be 7.8%, based on a number ratio of concave portions 141 of each subpixel and a light transmittance of each subpixel, but embodiments of the present disclosure are not limited thereto. For example, a random angle ratio can be calculated as the multiplication of a number ratio of concave portions 141 of each subpixel and a light transmittance of each subpixel. Such a random angle ratio can be used as a variable for setting a rotation angle of the light extraction pattern 140 of each subpixel by pixel P units.

A rotation angle of the light extraction pattern 140 of each subpixel in each of the plurality of pixels P[1,1] to P[n,m] can be set based on a reference rotation ratio of each subpixel.

A reference rotation ratio of each subpixel according to an embodiment of the present disclosure can be set based on a random angle ratio of the light extraction pattern 140 of each subpixel. For example, a reference rotation ratio of each subpixel can be set with respect to a random angle ratio of the first light extraction pattern 140a in the first subpixel SP1. For example, a first reference rotation ratio of the first light extraction pattern 140a in the first subpixel SP1 can be set to 1, but embodiments of the present disclosure are not limited thereto.

According to an embodiment of the present disclosure, a second reference rotation ratio of the second light extraction pattern 140b in the second subpixel SP2 can be a ratio "RAM1/RAM2" of a random angle ratio RAM1 of the first light extraction pattern 140a in the first subpixel SP1 to a random angle ratio RAM2 of the second light extraction pattern 140b in the second subpixel SP2. For example, a second reference rotation ratio of the second light extraction pattern 140b in the second subpixel SP2 can be set to 0.5, but embodiments of the present disclosure are not limited thereto.

According to an embodiment of the present disclosure, a third reference rotation ratio of the third light extraction pattern 140c in the third subpixel SP3 can be a ratio "RAM1/RAM3" of a random angle ratio RAM1 of the first light extraction pattern 140*a* in the first subpixel SP1 to a random angle ratio RAM3 of the third light extraction pattern 140*c* in the third subpixel SP3. For example, a third reference rotation ratio of the third light extraction pattern 140*c* in the third subpixel SP3 can be set to 1.1, but embodiments of the present disclosure are not limited thereto.

According to an embodiment of the present disclosure, a fourth reference rotation ratio of the fourth light extraction pattern 140*d* in the fourth subpixel SP4 can be a ratio "RAM1/RAM4" of a random angle ratio RAM1 of the first light extraction pattern 140*a* in the first subpixel SP1 to a random angle ratio RAM4 of the fourth light extraction pattern 140*d* in the fourth subpixel SP4. For example, a fourth reference rotation ratio of the fourth light extraction pattern 140*d* in the fourth subpixel SP4 can be set to 2.1, but embodiments of the present disclosure are not limited thereto.

According to an embodiment of the present disclosure, in each of the plurality of pixels P[1,1] to P[n,m], a rotation angle of the first light extraction pattern 140*a* in the first subpixel SP1 can be 2 times a rotation angle of the second light extraction pattern 140*b* in the second subpixel SP2, a rotation angle of the third light extraction pattern 140*c* in the third subpixel SP3 can be 2.2 times the rotation angle of the second light extraction pattern 140*b* in the second subpixel SP2, and a rotation angle of the light extraction pattern 140 in the fourth subpixel SP4 can be 4.2 times the rotation angle of the second light extraction pattern 140*b* in the second subpixel SP2. Therefore, an angle difference between rotation angles of the light extraction patterns 140 in each of the first to fourth subpixels SP1, SP2, SP3, and SP4 can be equal to one another by pixel P units. But embodiments of the present disclosure are not limited thereto.

The second light extraction pattern 140*b* in the second subpixel SP2 of each of the plurality of pixels P[1,1] to P[n,m] can have a rotation angle corresponding to a multiple of the second reference rotation ratio RRM2 "n×RRM2" (where n can be a natural number) in order along one or more of the first direction X and the second direction Y.

According to an embodiment of the present disclosure, when the reference angle deviation (or the second reference rotation ratio) is 0.5 degrees, a rotation angle of the second light extraction pattern 140*b* in the 1×1 pixel P[1,1] can be 0.5 degrees, a rotation angle of the second light extraction pattern 140*b* in the 1×2 pixel P[1,2] can be 1.0 degrees, a rotation angle of the second light extraction pattern 140*b* in the 1×3 pixel P[1,3] can be 1.5 degrees, a rotation angle of the second light extraction pattern 140*b* in the 2×1 pixel P[2,1] can be 1.0 degrees, and a rotation angle of the second light extraction pattern 140*b* in the 3×1 pixel P[3,1] can be 1.5 degrees.

According to another embodiment of the present disclosure, when the reference angle deviation (or the second reference rotation ratio) is 0.7 degrees, a rotation angle of the second light extraction pattern 140*b* in the 1×1 pixel P[1,1] can be 0.7 degrees, a rotation angle of the second light extraction pattern 140*b* in the 1×2 pixel P[1,2] can be 1.4 degrees, a rotation angle of the second light extraction pattern 140*b* in the 1×3 pixel P[1,3] can be 2.1 degrees, a rotation angle of the second light extraction pattern 140*b* in the 2×1 pixel P[2,1] can be 1.4 degrees, and a rotation angle of the second light extraction pattern 140*b* in the 3×1 pixel P[3,1] can be 2.1 degrees.

A rotation angle of the first light extraction pattern 140*a* in the first subpixel SP1 of each of the plurality of pixels P[1,1] to P[n,m] can be set based on a rotation angle and a second reference rotation ratio of the second light extraction pattern 140*b* in the second subpixel SP2 and a first reference rotation ratio of the first light extraction pattern 140*a*. For example, a rotation angle of the first light extraction pattern 140*a* of the first subpixel SP1 for each pixel can be set by a multiplication value "RA2/RRM2×RRM1" of a first reference rotation ratio RRM1 of the first light extraction pattern 140*a* and a ratio "RA2/RRM2" of a rotation angle RA2 of the second light extraction pattern 140*b* to a second reference rotation ratio RRM2 of the second light extraction pattern 140*b* within a same pixel.

According to an embodiment of the present disclosure, when the first reference rotation ratio RRM1 of the first light extraction pattern 140*a* is 1.0 degrees, the second reference rotation ratio RRM2 of the second light extraction pattern 140*b* is 0.5 degrees, and a rotation angle of the second light extraction pattern 140*b* of the 1×1 pixel P[1,1] is 0.5 degrees, a rotation angle of the first light extraction pattern 140*a* of the 1×1 pixel P[1,1] can be 1.0 degrees. For example, when the first reference rotation ratio RRM1 of the first light extraction pattern 140*a* is 1.0 degrees, the second reference rotation ratio RRM2 of the second light extraction pattern 140*b* is 0.5 degrees, and a rotation angle of the second light extraction pattern 140*b* of the 1×2 pixel P[1,2] is 1.0 degrees, a rotation angle of the first light extraction pattern 140*a* of the 1×2 pixel P[1,2] can be 2.0 degrees. As a result, in each of the plurality of pixels P[1,1] to P[n,m], a rotation angle of the first light extraction pattern 140*a* can be 2 times a rotation angle of the second light extraction pattern 140*b*.

According to another embodiment of the present disclosure, when the first reference rotation ratio RRM1 of the first light extraction pattern 140*a* is 1.0 degrees, the second reference rotation ratio RRM2 of the second light extraction pattern 140*b* is 0.5 degrees, and a rotation angle of the second light extraction pattern 140*b* of the 1×1 pixel P[1,1] is 0.7 degrees, a rotation angle of the first light extraction pattern 140*a* of the 1×1 pixel P[1,1] can be 1.4 degrees. For example, when the first reference rotation ratio RRM1 of the first light extraction pattern 140*a* is 1.0 degrees, the second reference rotation ratio RRM2 of the second light extraction pattern 140*b* is 0.5 degrees, and a rotation angle of the second light extraction pattern 140*b* of the 1×2 pixel P[1,2] is 1.4 degrees, a rotation angle of the first light extraction pattern 140*a* of the 1×2 pixel P[1,2] can be 2.8 degrees. As a result, in each of the plurality of pixels P[1,1] to P[n,m], a rotation angle of the first light extraction pattern 140*a* can be 2 times a rotation angle of the second light extraction pattern 140*b*.

A rotation angle of the third light extraction pattern 140*c* in the third subpixel SP3 of each of the plurality of pixels P[1,1] to P[n,m] can be set based on a rotation angle and a second reference rotation ratio of the second light extraction pattern 140*b* in the second subpixel SP2 and a third reference rotation ratio of the third light extraction pattern 140*c*. For example, a rotation angle of the third light extraction pattern 140*c* of the third subpixel SP3 for each pixel can be set by a multiplication value "RA2/RRM2×RRM3" of a third reference rotation ratio RRM3 of the third light extraction pattern 140*c* and a ratio "RA2/RRM2" of a rotation angle RA2 of the second light extraction pattern 140*b* to a second reference rotation ratio RRM2 of the second light extraction pattern 140*b* within a same pixel.

According to an embodiment of the present disclosure, when the third reference rotation ratio RRM3 of the third light extraction pattern 140*c* is 1.1 degrees, the second reference rotation ratio RRM2 of the second light extraction pattern 140*b* is 0.5 degrees, and a rotation angle of the second light extraction pattern 140*b* of the 1×1 pixel P[1,1] is 0.5 degrees, a rotation angle of the third light extraction pattern 140*c* of the 1×1 pixel P[1,1] can be 1.1 degrees. For example, when the first reference rotation ratio RRM1 of the first light extraction pattern 140*a* is 1.0 degrees, the second reference rotation ratio RRM2 of the second light extraction pattern 140*b* is 0.5 degrees, and a rotation angle of the second light extraction pattern 140*b* of the 1×2 pixel P[1,2] is 1.0 degrees, a rotation angle of the third light extraction pattern 140*c* of the 1×2 pixel P[1,2] can be 2.2 degrees. As a result, in each of the plurality of pixels P[1,1] to P[n,m], a rotation angle of the third light extraction pattern 140*c* can be 2.2 times a rotation angle of the second light extraction pattern 140*b*.

According to an embodiment of the present disclosure, when the third reference rotation ratio RRM3 of the third light extraction pattern 140*c* is 1.1 degrees, the second reference rotation ratio RRM2 of the second light extraction pattern 140*b* is 0.5 degrees, and a rotation angle of the second light extraction pattern 140*b* of the 1×1 pixel P[1,1] is 0.7 degrees, a rotation angle of the third light extraction pattern 140*c* of the 1×1 pixel P[1,1] can be 1.5 degrees. For example, when the third reference rotation ratio RRM3 of the third light extraction pattern 140*c* is 1.1 degrees, the second reference rotation ratio RRM2 of the second light extraction pattern 140*b* is 0.5 degrees, and a rotation angle of the second light extraction pattern 140*b* of the 1×2 pixel P[1,2] is 1.4 degrees, a rotation angle of the third light extraction pattern 140*c* of the 1×2 pixel P[1,2] can be 3.1 degrees. As a result, in each of the plurality of pixels P[1,1] to P[n,m], a rotation angle of the third light extraction pattern 140*c* can be 2.2 times a rotation angle of the second light extraction pattern 140*b*.

A rotation angle of the fourth light extraction pattern 140*d* in the fourth subpixel SP4 of each of the plurality of pixels P[1,1] to P[n,m] can be set based on a rotation angle and a second reference rotation ratio of the second light extraction pattern 140*b* in the second subpixel SP2 and a fourth reference rotation ratio of the fourth light extraction pattern 140*d*. For example, a rotation angle of the fourth light extraction pattern 140*d* of the fourth subpixel SP4 for each pixel can be set by a multiplication value "RA2/RRM2× RRM4" of a fourth reference rotation ratio RRM4 of the fourth light extraction pattern 140*d* and a ratio "RA2/RRM2" of a rotation angle RA2 of the second light extraction pattern 140*b* to a second reference rotation ratio RRM2 of the second light extraction pattern 140*b* within a same pixel.

According to an embodiment of the present disclosure, when the fourth reference rotation ratio RRM4 of the fourth light extraction pattern 140*d* is 2.1 degrees, the second reference rotation ratio RRM2 of the second light extraction pattern 140*b* is 0.5 degrees, and a rotation angle of the second light extraction pattern 140*b* of the 1×1 pixel P[1,1] is 0.5 degrees, a rotation angle of the first light extraction pattern 140*a* of the 1×1 pixel P[1,1] can be 2.1 degrees. For example, when the fourth reference rotation ratio RRM4 of the fourth light extraction pattern 140*d* is 2.1 degrees, the second reference rotation ratio RRM2 of the second light extraction pattern 140*b* is 0.5 degrees, and a rotation angle of the second light extraction pattern 140*b* of the 1×2 pixel P[1,2] is 1.0 degrees, a rotation angle of the fourth light extraction pattern 140*d* of the 1×2 pixel P[1,2] can be 4.2 degrees. As a result, in each of the plurality of pixels P[1,1]

to P[n,m], a rotation angle of the fourth light extraction pattern 140*d* can be 4.2 times a rotation angle of the second light extraction pattern 140*b*.

According to an embodiment of the present disclosure, when the fourth reference rotation ratio RRM4 of the fourth light extraction pattern 140*d* is 2.1 degrees, the second reference rotation ratio RRM2 of the second light extraction pattern 140*b* is 0.5 degrees, and a rotation angle of the second light extraction pattern 140*b* of the 1×1 pixel P[1,1] is 0.7 degrees, a rotation angle of the fourth light extraction pattern 140*d* of the 1×1 pixel P[1,1] can be 2.9 degrees. For example, when the fourth reference rotation ratio RRM4 of the fourth light extraction pattern 140*d* is 2.1 degrees, the second reference rotation ratio RRM2 of the second light extraction pattern 140*b* is 0.5 degrees, and a rotation angle of the second light extraction pattern 140*b* of the 1×2 pixel P[1,2] is 1.4 degrees, a rotation angle of the fourth light extraction pattern 140*d* of the 1×2 pixel P[1,2] can be 5.9 degrees. As a result, in each of the plurality of pixels P[1,1] to P[n,m], a rotation angle of the fourth light extraction pattern 140*d* can be 4.2 times a rotation angle of the second light extraction pattern 140*b*.

Figure 6A:
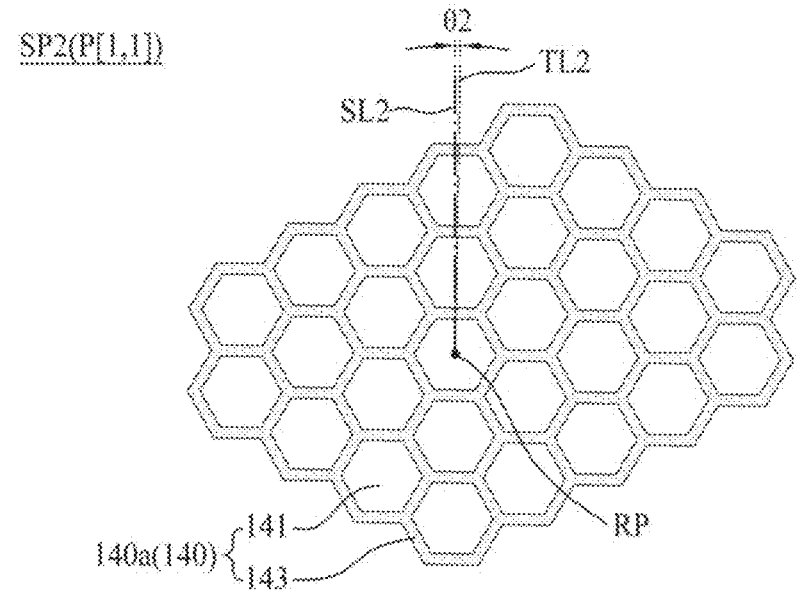
FIG. 6A is a diagram illustrating a rotation structure of a second light extraction pattern in a second subpixel of the 1×1 (or $1^{st}$ row, $1^{st}$ column) pixel illustrated in FIG. 5.
Figure 6B:
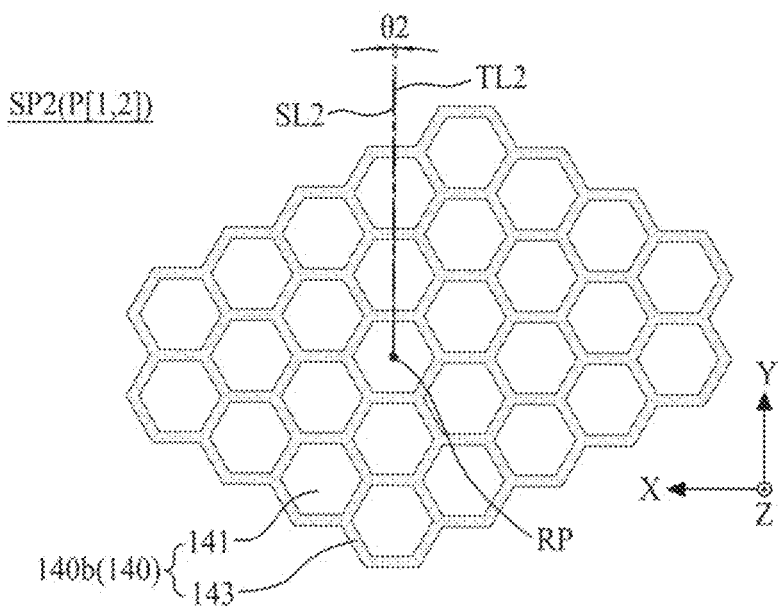
FIG. 6B is a diagram illustrating a rotation structure of a second light extraction pattern in a second subpixel of the 1×2 (or $1^{st}$ row, $2^{nd}$ column) pixel illustrated in FIG. 5.
Figure 7A:
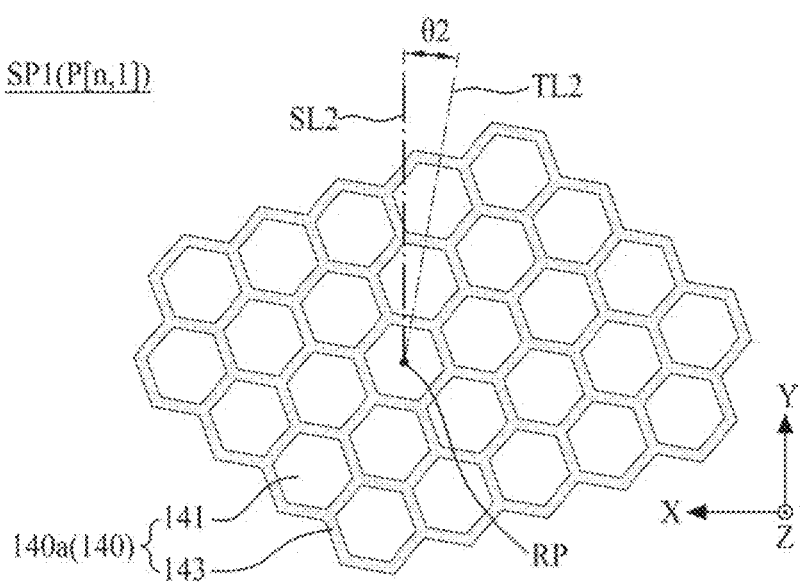
FIGS. 7A to 7D are diagrams illustrating a rotation structure of a light extraction pattern in each of first to fourth subpixels of the n×1 (or $n^{th}$ row, $1^{st}$ column) pixel illustrated in FIG. 5.
Figure 7B:
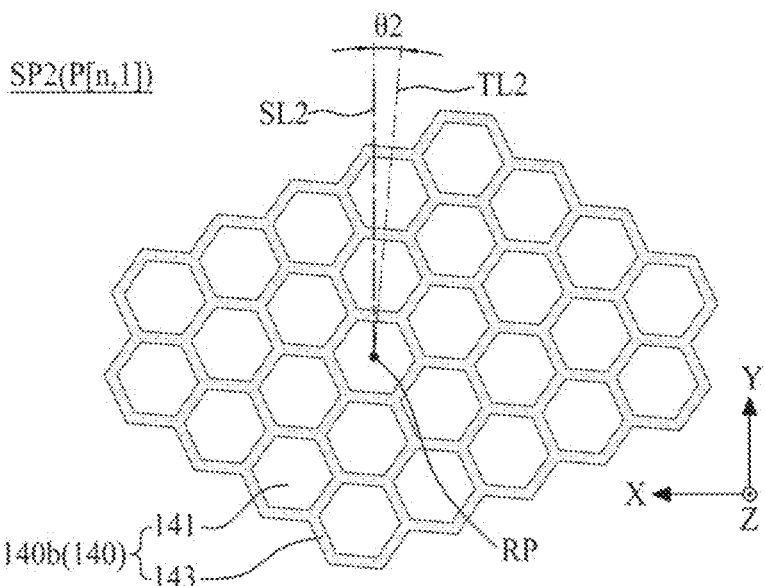
Figure 7C:
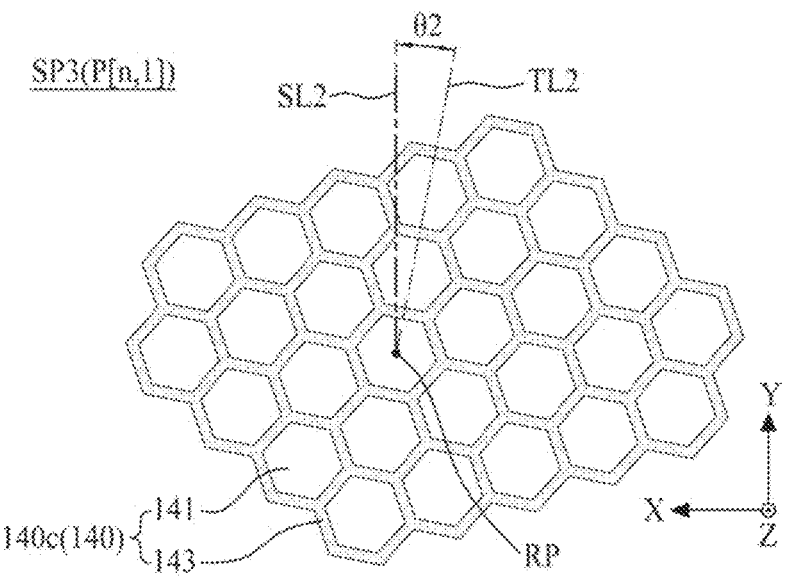
Figure 7D:
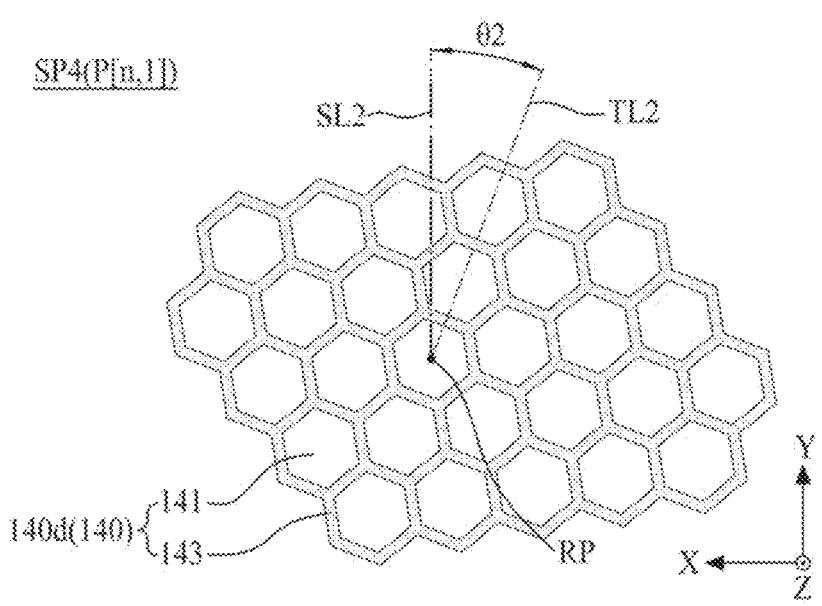

FIG. 6A is a diagram illustrating a rotation structure of a second light extraction pattern in a second subpixel of the 1×2 (or 1$^{st}$ row, 2$^{nd}$ column) pixel illustrated in FIG. 5, and FIG. 6B is a diagram illustrating a rotation structure of a second light extraction pattern in a second subpixel of the 1×1 (or 1$^{st}$ row, 1$^{st}$ column) pixel illustrated in FIG. 5.

As illustrated in FIGS. 6A and 6B, a rotation angle θ2 of a light extraction pattern 140 (or a second light extraction pattern 140*b*) at a second subpixel SP2 of a 1×1 (or 1$^{st}$ row, 1$^{st}$ column) pixel P[1,1] and a rotation angle θ2 of a light extraction pattern 140 (or a second light extraction pattern 140*b*) at a second subpixel SP2 of a 1×2 (or 1$^{st}$ row, 2$^{nd}$ column) pixel P[1,2] can have a 0.5-degree difference, based on a reference angle deviation of the second subpixels SP2. For example, in the second subpixel SP2 of the 1×1 (or 1$^{st}$ row, 1$^{st}$ column) pixel P[1,1], the rotation angle θ2 of the second light extraction pattern 140*b* which has rotated with respect to an arbitrary reference point RP can be 0.5 degrees, in the second subpixel SP2 of the 1×2 (or 1$^{st}$ row, 2$^{nd}$ column) pixel P[1,2], the rotation angle θ2 of the second light extraction pattern 140*b* which has rotated with respect to an arbitrary reference point RP can be 1.0 degrees. For example, the rotation angle θ2 of the second light extraction pattern 140*b* can be an angle between a second straight line SL2 and a second tilt line TL2.

FIGS. 7A to 7D are diagrams illustrating a rotation structure of a light extraction pattern in each of first to fourth subpixels of the n×1 (or n$^{th}$ row, 1$^{st}$ column) pixel illustrated in FIG. 5.

Referring to FIGS. 7A to 7D, in the n×1 (or n$^{th}$ row, 1$^{st}$ column) pixel, light extraction patterns 140 respectively provided at first to fourth subpixels SP1, SP2, SP3, and SP4 can rotate to have different rotation angles θ2. For example, the light extraction patterns 140 respectively provided at first to fourth subpixels SP1, SP2, SP3, and SP4 can rotate to have different rotation angles θ2 with respect to an arbitrary reference point RP. For example, a rotation angle θ2 of the light extraction pattern 140 can be an angle between a second straight line SL2 and a second tilt line TL2.

A second light extraction pattern 140*b* of the second subpixel SP2 can rotate with respect to an arbitrary reference point RP to have a rotation angle θ2 based on a second reference rotation ratio. For example, a rotation angle θ2 of the second light extraction pattern 140*b* which has rotated with respect to the arbitrary reference point RP can be a multiple of the second reference rotation ratio, or can be 5 degrees.

A first light extraction pattern 140a of the first subpixel SP1 can rotate with respect to the arbitrary reference point RP to have a rotation angle θ2 based on a first reference rotation ratio. For example, a rotation angle θ2 of the first light extraction pattern 140a can be greater than that of the second light extraction pattern 140b. For example, a rotation angle θ2 of the first light extraction pattern 140a which has rotated with respect to the arbitrary reference point RP can be 2 times a rotation angle of the second light extraction pattern 140b of the second subpixel SP2, or can be 10 degrees.

A third light extraction pattern 140c of the third subpixel SP3 can rotate with respect to an arbitrary reference point RP to have a rotation angle θ2 based on a third reference rotation ratio. For example, a rotation angle θ2 of the third light extraction pattern 140c can be greater than that of the first and second light extraction patterns 140a and 140b. For example, a rotation angle θ2 of the third light extraction pattern 140c which has rotated with respect to the arbitrary reference point RP can be 2.2 times a rotation angle of the second light extraction pattern 140b of the second subpixel SP2, or can be 11 degrees.

A fourth light extraction pattern 140d of the fourth subpixel SP4 can rotate with respect to the arbitrary reference point RP to have a rotation angle θ2 based on a fourth reference rotation ratio. For example, a rotation angle of the fourth light extraction pattern 140d can be greater than that of each of the first to fourth light extraction patterns 140a, 140b, and 140c. For example, a rotation angle θ2 of the fourth light extraction pattern 140d which has rotated with respect to the arbitrary reference point RP can be 4.2 times a rotation angle of the second light extraction pattern 140b of the second subpixel SP2, or can be 21 degrees.

In various embodiments of the present disclosure, the arbitrary reference point RP can intersect one or more of the first straight line SL1, the first tilt line TL1, the second straight line SL2 and the second tilt line TL2.

Therefore, the organic light emitting display apparatus including the light extraction pattern 140 according to the first embodiment of the present disclosure can include the light extraction patterns 140 which have rotated by different angles for each subpixel, and thus, can prevent or minimize the occurrence of radial-shaped rainbow Mura and radial-shaped circular ring Mura of reflected light caused by the irregularity or randomness of a diffraction pattern of the reflected light based on a rotation angle of the light extraction pattern 140 of each subpixel. Accordingly, a black visibility characteristic or a black color (or black rising) phenomenon caused by the reflection of external light can be reduced in a non-driving or off state, and the occurrence of rainbow Mura and circular ring Mura can be minimized or reduced, thereby implementing true black.

Moreover, the organic light emitting display apparatus including the light extraction pattern 140 according to the first embodiment of the present disclosure can include the light extraction patterns 140 which have rotated by different angles for each subpixel, based on a number ratio of subpixel-based concave portions 141 of the light extraction pattern 140 and a light transmittance of each subpixel, and thus, a sense of color of red, green, and yellow in reflected light can be reduced or minimized due to the irregularity or randomness of a diffraction pattern of the reflected light based on a rotation angle of the light extraction pattern 140 of each subpixel.

Furthermore, in the organic light emitting display apparatus including the light extraction pattern 140 according to the first embodiment of the present disclosure, rotation angles of the light extraction patterns 140 which have rotated by different angles for each subpixel can be regularly set based on a reference angle deviation, and thus, rotation angles of the light extraction patterns 140 provided in all subpixels can be easily designed or set.

Figure 8:
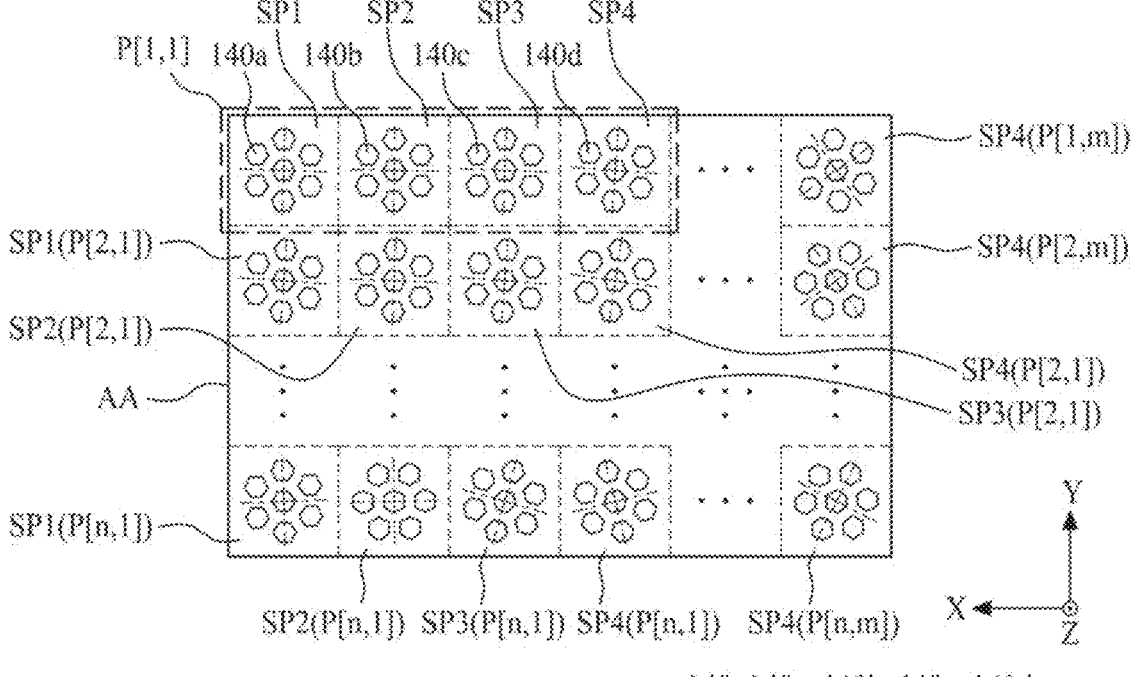
FIG. 8 is a diagram illustrating a rotation structure of a light extraction pattern according to a second embodiment of the present disclosure.

FIG. 8 is a diagram illustrating a rotation structure of a light extraction pattern according to a second embodiment of the present disclosure. FIG. 8 illustrates an embodiment implemented by modifying a reference angle deviation of a second subpixel in the rotation structure of the light extraction pattern described above with reference to FIG. 5. In the following description, repeated descriptions of the other elements except a reference angle deviation of a second subpixel and relevant elements are omitted. Therefore, the description of FIG. 5 can be included in a description of FIG. 8.

Referring to FIG. 8, in an organic light emitting display apparatus according to the second embodiment of the present disclosure, a reference angle deviation of a second light extraction pattern 140b formed at a second subpixel SP2 of each of a plurality of pixels P[1,1] to P[n,m] can be set to Fibonacci numbers of 1 and 1 or more. For example, Fibonacci numbers can be an infinite sequence where a sum of a previous term "Fn−1" and a current term "Fn" is "Fn−1+Fn". In Fibonacci numbers, intervals can be irregular, and thus, instead of repetition of a 60-degree unit, repetition of a 360-degree unit can be performed and an angle of 360 degrees or more can be reflected. For example, a digit of more than 360 in Fibonacci numbers of 1 and 1 or more can be set to a reference angle deviation as 360 or a multiple of 360 is subtracted. For example, a reference angle deviation based on Fibonacci numbers of 1 and 1 or more can be set to 1, 1, 2, 3, 5, 8, 13, 21, 34, 55, 89, 144, 233, 17, 250, 267, 157, 64, 221, 285, and 146.

The second light extraction pattern 140b of the second subpixel SP2 of each of the plurality of pixels P[1,1] to P[n,m] can have a rotation angle corresponding to a reference angle deviation based on Fibonacci numbers of 1 and 1 or more in order along one or more of a first direction X and a second direction Y.

According to an embodiment of the present disclosure, when the second reference rotation ratio is 0.5 degrees, a rotation angle of the second light extraction pattern 140b in the 1×1 pixel P[1,1] can be 1.0 degrees, a rotation angle of the second light extraction pattern 140b in the 1×2 pixel P[1,2] can be 2.0 degrees, a rotation angle of the second light extraction pattern 140b in the 1×3 pixel P[1,3] can be 3.0 degrees, a rotation angle of the second light extraction pattern 140b in the 2×1 pixel P[2,1] can be 2.0 degrees, and a rotation angle of the second light extraction pattern 140b in the 3×1 pixel P[3,1] can be 3.0 degrees.

A rotation angle of a first light extraction pattern 140a at a first subpixel SP1 of each of the plurality of pixels P[1,1] to P[n,m], as described above with reference to FIG. 5, can be set based on a multiplication value "RA2/RRM2×RRM1" of a first reference rotation ratio RRM1 of the first light extraction pattern 140a and a ratio "RA2/RRM2" of a rotation angle RA2 of the second light extraction pattern 140b to a second reference rotation ratio RRM2 of the second light extraction pattern 140b in a same pixel. For example, in each of the plurality of pixels P[1,1] to P[n,m], a rotation angle of the first light extraction pattern 140a can be 2 times a rotation angle of the second light extraction pattern 140b.

A rotation angle of a third light extraction pattern 140c at a third subpixel SP3 of each of the plurality of pixels P[1,1] to P[n,m], as described above with reference to FIG. 5, can be set based on a multiplication value "RA2/RRM2×RRM3" of a third reference rotation ratio RRM3 of the third light extraction pattern 140c and a ratio "RA2/RRM2" of a rotation angle RA2 of the second light extraction pattern 140b to a second reference rotation ratio RRM2 of the second light extraction pattern 140b in a same pixel. For example, in each of the plurality of pixels P[1,1] to P[n,m], a rotation angle of the third light extraction pattern 140c can be 2.2 times a rotation angle of the second light extraction pattern 140b.

A rotation angle of a fourth light extraction pattern 140d at a fourth subpixel SP4 of each of the plurality of pixels P[1,1] to P[n,m], as described above with reference to FIG. 5, can be set based on a multiplication value "RA2/RRM2× RRM4" of a fourth reference rotation ratio RRM4 of the fourth light extraction pattern 140d and a ratio "RA2/ RRM2" of a rotation angle RA2 of the second light extraction pattern 140b to a second reference rotation ratio RRM2 of the second light extraction pattern 140b in a same pixel. For example, in each of the plurality of pixels P[1,1] to P[n,m], a rotation angle of the fourth light extraction pattern 140d can be 4.2 times a rotation angle of the second light extraction pattern 140b.

According to another embodiment of the present disclosure, the second light extraction pattern 140b at a second subpixel SP2 of each of the plurality of pixels P[1,1] to P[n,m] can have a rotation angle based on Fibonacci numbers of 1 or more in order along one or more of the first direction X and the second direction Y. For example, a rotation angle of the second light extraction pattern 140b at a 1×1 pixel P[1,1] can be 1.0 degrees, a rotation angle of the second light extraction pattern 140b at a 1×2 pixel P[1,2] can be 2.0 degrees, a rotation angle of the second light extraction pattern 140b at a 1×3 pixel P[1,3] can be 3.0 degrees, a rotation angle of the second light extraction pattern 140b at a 2×1 pixel P[2,1] can be 2.0 degrees, and a rotation angle of the second light extraction pattern 140b at a 3×1 pixel P[3,1] can be 3.0 degrees. In this case, in each of the plurality of pixels P[1,1] to P[n,m], a rotation angle of the first light extraction pattern 140a can be 2 times a rotation angle of the second light extraction pattern 140b in a same pixel, a rotation angle of the third light extraction pattern 140c can be 2.2 times the rotation angle of the second light extraction pattern 140b in a same pixel, and a rotation angle of the fourth light extraction pattern 140d can be 4.2 times the rotation angle of the second light extraction pattern 140b in a same pixel.

Therefore, the organic light emitting display apparatus including the light extraction pattern 140 according to the second embodiment of the present disclosure can include the light extraction patterns 140 which have rotated by different angles for each subpixel based on an irregular Fibonacci numbers, and thus, can prevent or minimize the occurrence of radial-shaped rainbow Mura and radial-shaped circular ring Mura of reflected light caused by the irregularity or randomness of a diffraction pattern of the reflected light based on a rotation angle of the light extraction pattern 140 of each subpixel. Accordingly, a black visibility characteristic or a black color (or black rising) phenomenon caused by the reflection of external light can be reduced in a non-driving or off state, and the occurrence of rainbow Mura and circular ring Mura can be minimized or reduced, thereby implementing true black.

Moreover, the organic light emitting display apparatus including the light extraction pattern 140 according to the second embodiment of the present disclosure can include the light extraction patterns 140 which have rotated by different angles for each subpixel, based on a number ratio of subpixel-based concave portions 141 of the light extraction pattern 140, a light transmittance of each subpixel, and an irregular Fibonacci numbers, and thus, a sense of color of red, green, and yellow in reflected light can be reduced or minimized due to the irregularity or randomness of a diffraction pattern of the reflected light based on a rotation angle of the light extraction pattern 140 of each subpixel.

Furthermore, in the organic light emitting display apparatus including the light extraction pattern 140 according to the second embodiment of the present disclosure, rotation angles of the light extraction patterns 140 which have rotated by different angles for each subpixel based on an irregular Fibonacci numbers can be regularly set based on a reference angle deviation, and thus, rotation angles of the light extraction patterns 140 provided in all subpixels can be easily designed or set.

Figure 9A:
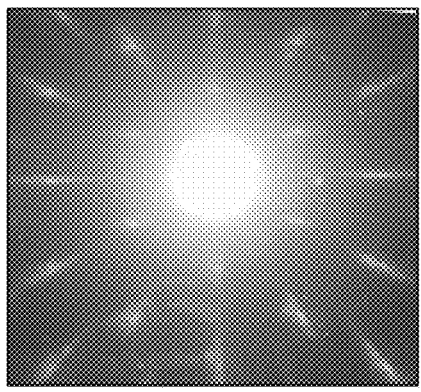
FIG. 9A is a photograph showing a rainbow Mura based on a reflection of external light, in an organic light emitting display apparatus according to an experimental example.
Figure 9B:
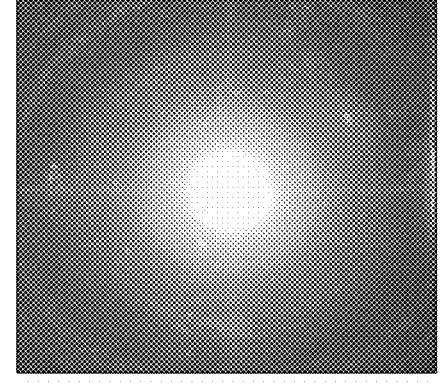
FIG. 9B is a photograph showing a circular ring Mura based on a reflection of external light, in the organic light emitting display apparatus according to the experimental example.
Figure 9C:
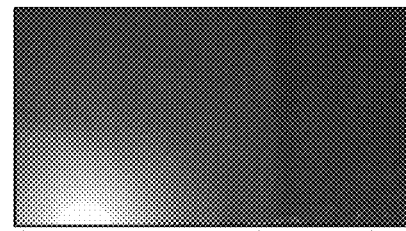
FIG. 9C is a photograph showing a black visibility characteristic of an organic light emitting display apparatus according to an embodiment of the present disclosure.

FIG. 9A is a photograph showing rainbow Mura based on reflection of external light, in an organic light emitting display apparatus according to an experimental example. FIG. 9B is a photograph showing circular ring Mura based on reflection of external light, in the organic light emitting display apparatus according to the experimental example. FIG. 9C is a photograph showing a black visibility characteristic of an organic light emitting display apparatus according to an embodiment of the present disclosure. The organic light emitting display apparatus according to the experimental example of FIGS. 9A and 9B has a rotation angle of 0 degrees where a light extraction pattern of each subpixel does not rotate. The experimental of each of FIGS. 9A to 9C has used the organic light emitting display apparatus on which a polarization member is not attached. In each of FIGS. 9A to 9C, a brightest white region occurs based on a wavelength having strongest intensity among reflected lights.

As seen in FIGS. 9A and 9B, in the organic light emitting display apparatus according to the experimental example, it can be seen that radial-shaped rainbow Mura and radial-shaped circular ring Mura occur due to reflected light reflected from a light extraction pattern which does not rotate, and due to this, a black visibility characteristic is reduced.

As seen in FIG. 9C, the organic light emitting display apparatus according to an embodiment of the present disclosure can include light extraction patterns 140 which have rotated by different angles for each subpixel, and thus, due to a difference between rotation angles of light extraction patterns of subpixels by subpixel units, it can be seen that the occurrence of radial-shaped rainbow Mura and radial-shaped circular ring Mura is prevented or minimized, and thus, a black visibility characteristic is enhanced.

An organic light emitting display apparatus according to an embodiment of the present disclosure will be described below.

An organic light emitting display apparatus according to an embodiment of the present disclosure can comprise a plurality of pixels each including a plurality of subpixels having emissions region on a substrate, a planarization layer including a light extraction pattern which is at/on/in the emission region of each of the plurality of subpixels and includes a plurality of concave portions, and a light emitting device layer on the light extraction pattern. The light extraction pattern at/on/in each of the plurality of subpixels can comprise a structure which has rotated by different angles with respect to a reference point or reference line within a corresponding emission region.

The light extraction pattern may include further a convex portion, e.g. a convex portion surrounding the plurality of concave portions.

The light extraction pattern at each of the plurality of subpixels may comprise a structure which has rotated with respect to a reference point or reference line within a corresponding emission region.

The number of concave portions at the light extraction patterns of the plurality of subpixels may be different from each other, and/or the light extraction pattern at a subpixel including a largest number of concave portions among the plurality of subpixels may have a smallest rotation angle.

The reference point may be a center point of a reference concave portion among the plurality of concave portions of the light extraction pattern of the respective subpixel.

The reference line may be a first straight line extending parallel to a first direction or a second straight line extending parallel to a second direction, and passing through a center point of a reference concave portion among the plurality of concave portions of the light extraction pattern of the respective subpixel.

The display apparatus may include a plurality of gate lines extending parallel to the first direction. The display apparatus may include a plurality of data lines extending parallel to the second direction. The subpixels of each pixel may be arranged in the first direction and/or in the second direction.

For each subpixel, center points of the plurality of concave portions of the light extraction pattern of said subpixel may be arranged along a first tilt line and/or along a second tilt line. The first tilt line may form an angle (e.g. rotation angle of the light extraction pattern of said subpixel) with the first reference line, e.g. an angle larger than 0° and/or smaller than 60°. The second tilt line may form an angle (e.g. rotation angle of the light extraction pattern of said subpixel) with the second reference line, e.g. an angle larger than 0° and/or smaller than 60°. That is, the rotation angle of the light extraction pattern of a subpixel may be defined as the angle between the first tilt line and the first reference line or as the angle between the second tilt line and the second reference line.

The concave portion of the light extraction pattern of each subpixel may have a polygonal or hexagonal shape. The light extraction patterns of the plurality of subpixels may have the same shape and/or structure. The light extraction patterns of the plurality of subpixels be rotated with respect to the reference line by different rotation angles.

The plurality of subpixels of one pixel may be configured to emit light of different colors, e.g. by means of a color filter layer disposed between the light emitting device layer and the light extraction pattern.

The light extraction pattern of each subpixel may cover the emission region of said subpixel.

The planarization layer may include a planarized surface between the light extraction patterns in the emission regions of the subpixels.

According to one or more embodiments of the present disclosure, the plurality of subpixels can comprise first to fourth subpixels. For instance, the plurality of subpixels may comprise a first or red subpixel, a second or white subpixel, a third or green subpixel, and a fourth or blue subpixel, and angle differences between rotation angles of the light extraction patterns at each of two second, e.g. white, subpixels adjacent to each other along one or more directions of a first direction and a second direction intersecting with the first direction can be equal to each other. The angle differences may be one of angles of greater than 0 degrees and less than 60 degrees, in particular the angle differences may be 0.5 or 0.7.

Angle differences between rotation angles of the light extraction patterns of any two subpixels adjacent to each other in the first direction and/or in the second direction may be different from each other in the direction According to one or more embodiments of the present disclosure, the plurality of subpixels can comprise a red subpixel, a white subpixel, a green subpixel, and a blue subpixel, and the light extraction pattern at the white subpixel can have a rotation angle based on Fibonacci numbers of 1 or more in order along one or more directions of a first direction and a second direction intersecting with the first direction.

According to one or more embodiments of the present disclosure, the plurality of subpixels can have different sizes (e.g. of the emission regions), and the light extraction pattern of a subpixel having a largest size among the plurality of subpixels can have a smallest rotation angle.

According to one or more embodiments of the present disclosure, the plurality of subpixels can have different transmittances, and the light extraction pattern of a subpixel having a highest transmittance among the plurality of subpixels can have a smallest rotation angle.

According to one or more embodiments of the present disclosure, rotation angles of the light extraction patterns at each of the plurality of subpixels can be different from each other by pixel units. Rotation angles of the light extraction patterns of all subpixels within a unit of pixels (i.e. a predetermined number of adjacent pixels) may be different from each other.

According to one or more embodiments of the present disclosure, angle differences between rotation angles of the light extraction patterns at each of the plurality of subpixels can be equal to one another by pixel units. Angle differences between rotation angles of the light extraction patterns of all subpixels within a unit of pixels (i.e. a predetermined number of adjacent pixels) may be equal to one another.

According to one or more embodiments of the present disclosure, the organic light emitting display apparatus may further comprise a color filter layer between the light extraction pattern and the substrate.

According to one or more embodiments of the present disclosure, the planarization layer may have a refractive index of less than 1.57, or may have a same refractive index as a refractive index of the substrate.

An organic light emitting display apparatus according to an embodiment of the present disclosure can comprise a plurality of pixels each including first to fourth subpixels having emission regions on a substrate, a planarization layer including a light extraction pattern which is at the emission region of each of the first to fourth subpixels and includes a convex portion and a plurality of concave portions, and a light emitting device layer on the light extraction pattern, the light extraction pattern at each of the first to fourth subpixels can comprise a structure which has rotated with respect to a reference point within a corresponding emission region, and/or the number of concave portions at the light extraction patterns of the first to fourth subpixels can be different from each other, and/or the light extraction pattern at a subpixel including a largest number of concave portions among the plurality of subpixels can have a smallest rotation angle.

According to one or more embodiments of the present disclosure, the light extraction patterns at each of the plurality of subpixels, e.g. each of the first to fourth subpixels, can have rotated by different rotation angles with respect to a center portion (or a center point) of one of the plurality of concave portions within a corresponding emission region.

According to one or more embodiments of the present disclosure, the light extraction pattern at the second subpixel can have a rotation angle based on Fibonacci numbers of 1 or more in order along one or more directions of a first direction and a second direction intersecting with the first direction.

According to one or more embodiments of the present disclosure, angle differences between rotation angles of the light extraction patterns of two second subpixels adjacent to each other along one or more directions of a first direction and a second direction intersecting with the first direction can be equal to each other.

According to one or more embodiments of the present disclosure, the angle differences can be one of angles of greater than 0 degrees and less than 60 degrees.

According to one or more embodiments of the present disclosure, the angle differences can be 0.5 or 0.7.

According to one or more embodiments of the present disclosure, the first to fourth subpixels can have different sizes, the second subpixel can have a largest size, and/or the light extraction pattern of the second subpixel can have a smallest rotation angle.

According to one or more embodiments of the present disclosure, the first to fourth subpixels can have different transmittances, the second subpixel can have a highest transmittance, and/or the light extraction pattern of the second subpixel can have a smallest rotation angle.

According to one or more embodiments of the present disclosure, rotation angles of the light extraction patterns at each of the first to fourth subpixels can be different from each other by pixel units.

According to one or more embodiments of the present disclosure, angle differences between rotation angles of the light extraction patterns at each of the plurality of subpixels, e.g. at each of the first to fourth subpixels, can be equal to one another by pixel units.

According to one or more embodiments of the present disclosure, the second subpixel can be a white subpixel.

According to one or more embodiments of the present disclosure, the organic light emitting display apparatus can further comprise a color filter layer between the light extraction pattern and the substrate.

According to one or more embodiments of the present disclosure, the planarization layer can have a refractive index of less than 1.57, or can have a same refractive index as a refractive index of the substrate.

The organic light emitting display apparatus according to an embodiment of the present disclosure can be applied to various electronic apparatuses. For example, the organic light emitting display apparatus according to an embodiment of the present disclosure can be applied to mobile devices, video phones, smart watches, watch phones, wearable devices, foldable devices, rollable devices, bendable devices, flexible devices, curved devices, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, and home appliances, or the like.

It will be apparent to those skilled in the art that various modifications and variations can be made in the present disclosure without departing from the scope of the disclosures. Thus, it is intended that the present disclosure covers the modifications and variations of this disclosure provided they come within the scope of the appended claims and their equivalents.

What is claimed is:

1. An organic light emitting display apparatus comprising:
a substrate;
a plurality of pixels on the substrate, each pixel including a plurality of subpixels, and each of the plurality of subpixels having an emission region;
a planarization layer including a light extraction pattern, the light extraction pattern disposed at the emission region of each of the plurality of subpixels and including a plurality of concave portions; and
a light emitting device layer on the light extraction pattern of each of the plurality of subpixels,
wherein the emission region of each of the plurality of subpixels includes a reference point disposed at a concave portion of the plurality of concave portions,
wherein the light extraction pattern of each of the plurality of subpixels has a rotation angle with respect to the reference point, and
wherein the rotation angles of the light extraction patterns of the plurality of subpixels are different with respect to the reference points of the emission regions of the plurality of subpixels.

2. The organic light emitting display apparatus of claim 1, wherein the plurality of subpixels comprise a red subpixel, a white subpixel, a green subpixel, and a blue subpixel, and wherein the rotation angles of the light extraction patterns of two white subpixels adjacent to each other corresponding to adjacent two pixels among the plurality of pixels are approximately equal to each other.

3. The organic light emitting display apparatus of claim 1, wherein the plurality of subpixels comprise a red subpixel, a white subpixel, a green subpixel, and a blue subpixel, and wherein the light extraction pattern of the white subpixel has the rotation angle based on Fibonacci numbers of 1 or more in order along at least one of a first direction and a second direction intersecting with the first direction.

4. The organic light emitting display apparatus of claim 1, wherein the plurality of subpixels have different sizes, and wherein the light extraction pattern of a subpixel having a largest size among the plurality of subpixels has a smallest rotation angle from among the rotation angles.

5. The organic light emitting display apparatus of claim 1, wherein the plurality of subpixels have different transmittances, and wherein the light extraction pattern of a subpixel having a highest transmittance from among the plurality of subpixels has a smallest rotation angle from among the rotation angles.

6. The organic light emitting display apparatus of claim 1, wherein the rotation angles of the light extraction patterns of the plurality of subpixels in the plurality of pixels are different from each other.

7. The organic light emitting display apparatus of claim 1, wherein angle differences between the rotation angles of the light extraction patterns of the plurality of subpixels in the plurality of pixels are approximately equal to one another.

8. An organic light emitting display apparatus comprising:

a plurality of pixels on a substrate, each pixel including first to fourth subpixels each having an emission region;

a planarization layer including a light extraction pattern disposed at the emission region of each of the first to fourth subpixels, the light extraction pattern including a convex portion and a plurality of concave portions; and a light emitting device layer on the light extraction pattern, wherein the emission region of each of the first to fourth subpixels includes a reference point disposed at a concave portion of the plurality of concave portions, wherein the light extraction pattern at each of the first to fourth subpixels comprises a rotation angle with respect to the reference point, wherein numbers of the plurality of concave portions of the light extraction patterns of the first to fourth subpixels are different from each other, and wherein the light extraction pattern of a subpixel including a largest number of the plurality of concave portions among the first to fourth subpixels has a smallest rotation angle from among the rotation angles of the first to fourth subpixels.

9. The organic light emitting display apparatus of claim 8, wherein the light extraction patterns of each of the first to fourth subpixels have different rotation angles with respect to a center portion of one of the plurality of concave portions within a corresponding emission region of the one of the first to fourth subpixels.

10. The organic light emitting display apparatus of claim 8, wherein the light extraction pattern at the second subpixel has the rotation angle based on Fibonacci numbers of 1 or more in order along at least one of a first direction and a second direction intersecting with the first direction.

11. The organic light emitting display apparatus of claim 8, wherein, among the plurality of pixels, angle differences between rotation angles of the light extraction patterns of two second subpixels adjacent to each other along at least one of a first direction and a second direction intersecting with the first direction are approximately equal to each other.

12. The organic light emitting display apparatus of claim 11, wherein the angle differences are greater than 0 degrees and less than approximately 60 degrees.

13. The organic light emitting display apparatus of claim 12, wherein the angle differences are approximately 0.5 degrees or approximately 0.7 degrees.

14. The organic light emitting display apparatus of claim 8, wherein the first to fourth subpixels have different sizes, wherein the second subpixel has a largest size from among the first to fourth subpixels, and wherein the light extraction pattern of the second subpixel has a smallest rotation angle from among those of the first to fourth subpixels.

15. The organic light emitting display apparatus of claim 8, wherein the first to fourth subpixels have different transmittances, wherein the second subpixel has a highest transmittance from among the first to fourth subpixels, and wherein the light extraction pattern of the second subpixel has a smallest rotation angle from among those of the first to fourth subpixels.

16. The organic light emitting display apparatus of claim 8, wherein the rotation angles of the light extraction patterns at each of the first to fourth subpixels in the plurality of pixels are different from each other.

17. The organic light emitting display apparatus of claim 8, wherein angle differences between the rotation angles of the light extraction patterns at each of the first to fourth subpixels in the plurality of pixels are approximately equal to one another.

18. The organic light emitting display apparatus of claim 8, further comprising a color filter layer between the light extraction pattern and the substrate.

19. The organic light emitting display apparatus of claim 8, wherein the planarization layer has a refractive index of less than approximately 1.57, or has a same refractive index as a refractive index of the substrate.

20. An organic light emitting display apparatus comprising:

at least one pixel on a substrate, the at least one pixel including a plurality of subpixels, and the plurality of subpixels including a plurality of emission regions, respectively, and including a light emitting device layer, respectively; and a plurality of light extraction patterns disposed in the plurality of emission regions, respectively, wherein the plurality of light extraction patterns of the plurality of subpixels include reference points that intersect with a first axis and a second axis, respectively, and include rotation angles with respect to the reference points, respectively, and wherein the rotation angles of the plurality of light extraction patterns are different from each other.

* * * * *